(12) United States Patent
Irani et al.

(10) Patent No.: US 7,811,887 B2
(45) Date of Patent: Oct. 12, 2010

(54) FORMING SILICON TRENCH ISOLATION (STI) IN SEMICONDUCTOR DEVICES SELF-ALIGNED TO DIFFUSION

(75) Inventors: Rustom Irani, Santa Clara, CA (US); Amichai Givant, Rosh-Ha'ain (IL)

(73) Assignee: Saifun Semiconductors Ltd., Netanya (IL)

( * ) Notice: Subject to any disclaimer, the term of this patent is extended or adjusted under 35 U.S.C. 154(b) by 237 days.

(21) Appl. No.: 11/979,313

(22) Filed: Nov. 1, 2007

(65) Prior Publication Data
US 2008/0128774 A1   Jun. 5, 2008

Related U.S. Application Data

(60) Provisional application No. 60/856,025, filed on Nov. 2, 2006.

(51) Int. Cl.
    *H01L 21/336* (2006.01)
(52) U.S. Cl. .............................. 438/262; 257/E21.409; 257/E29.226
(58) Field of Classification Search .................. 438/262; 257/E21.409, E29.226
    See application file for complete search history.

(56) References Cited

U.S. PATENT DOCUMENTS

| | | | |
|---|---|---|---|
| 5,650,959 A | 7/1997 | Hayashi et al. | |
| 5,768,192 A | 6/1998 | Eitan | |
| 5,963,465 A | 10/1999 | Eitan | |
| 5,966,603 A | 10/1999 | Eitan | |
| 6,011,725 A | 1/2000 | Eitan | |
| 6,030,871 A | 2/2000 | Eitan | |
| 6,130,452 A | 10/2000 | Lu et al. | |
| 6,133,095 A | 10/2000 | Eitan et al. | |
| 6,175,519 B1 | 1/2001 | Lu et al. | |
| 6,215,148 B1 | 4/2001 | Eitan | |
| 6,233,180 B1 | 5/2001 | Eitan et al. | |
| 6,285,574 B1 | 9/2001 | Eitan | |
| 6,292,394 B1 | 9/2001 | Cohen et al. | |
| 6,448,750 B1 | 9/2002 | Shor et al. | |
| 6,477,084 B1 | 11/2002 | Eitan | |
| 6,552,387 B1 | 4/2003 | Eitan | |
| 6,583,007 B1 | 6/2003 | Eitan | |
| 6,633,496 B2 | 10/2003 | Maayan et al. | |

(Continued)

OTHER PUBLICATIONS

Stanley Wolf Silicon Processing for the VSLI EAR vol. IV Lattice Press 2002 pp. 556,580.*
Stanley Wolf Silicon Processing for the VSLI EAR vol. I Lattice Press 1986 pp. 50,55.*

*Primary Examiner*—David S Blum
(74) *Attorney, Agent, or Firm*—Eitan Mehulal Law Group

(57) ABSTRACT

Silicon trench isolation (STI) is formed between adjacent diffusions in a semiconductor device, such as between bitlines in a memory array. The STI may be self-aligned to the diffusions, and may prevent misaligned bitline (BL) contacts from contacting silicon outside of the corresponding bitlines. The bitline contacts may have sufficient overlap of the bitlines to ensure full coverage by the bitlines. Bitline oxides formed over buried bitlines may be used to self-align trenches of the STI to the bitlines. The STI trenches may be lined with a CMOS spacer, salicide blocking layer and/or a contact etch stop layer. STI may be formed after Poly-2 etch or after word line salicidation. The memory cells may be NVM devices such as NROM, SONOS, SANOS, MANOS, TANOS or Floating Gate (FG) devices.

7 Claims, 19 Drawing Sheets

U.S. PATENT DOCUMENTS

| | | |
|---|---|---|
| 6,649,972 B2 | 11/2003 | Eitan |
| 6,768,165 B1 | 7/2004 | Eitan |
| 6,954,393 B2 | 10/2005 | Lusky et al. |
| 6,967,896 B2 | 11/2005 | Eisen et al. |
| 2009/0323423 A1* | 12/2009 | Bloom et al. .......... 365/185.18 |
| 2010/0013015 A1* | 1/2010 | Snyder ....................... 257/347 |

* cited by examiner

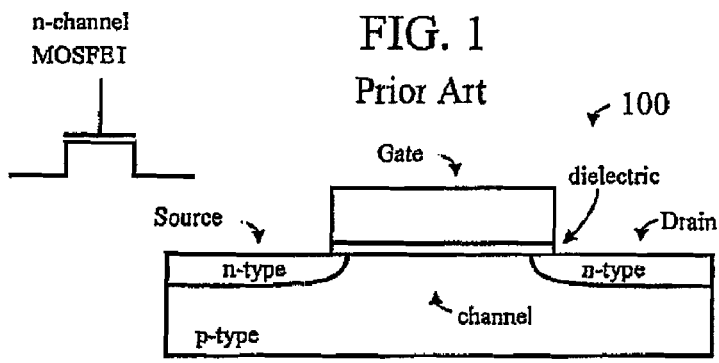
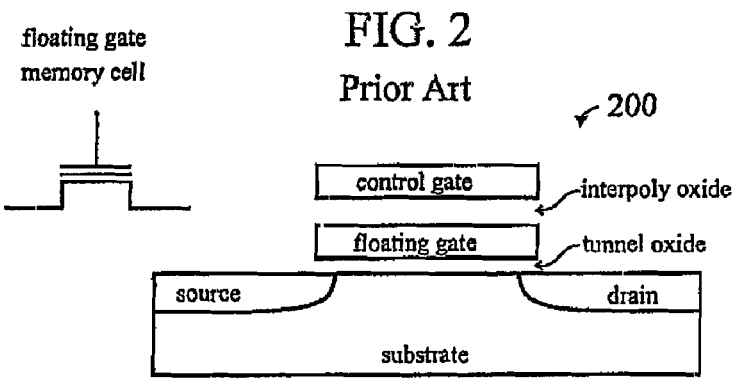
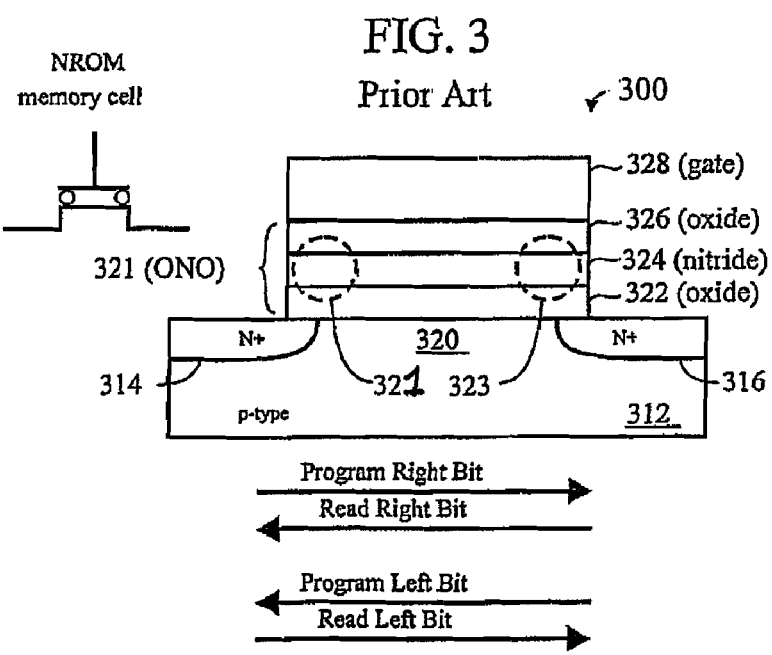

FORMING SILICON TRENCH ISOLATION (STI) IN SEMICONDUCTOR DEVICES SELF-ALIGNED TO DIFFUSION

CROSS-REFERENCE(S) TO RELATED APPLICATION(S)

This application claims the benefit of U.S. Provisional Application No. 60/856,025, filed Nov. 2, 2006, the entire disclosure of which is incorporated herein by reference.

TECHNICAL FIELD

The disclosure relates to techniques for fabricating semiconductor devices and, more particularly, to forming arrays of non-volatile memory (NVM) cells.

BACKGROUND

The Field Effect Transistor

The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals.

The terminals of a field effect transistor (FET) are commonly named source, gate and drain. In the FET a small amount of voltage is applied to the gate in order to control current flowing between the source and drain. In FETs the main current appears in a narrow conducting channel formed near (usually primarily under) the gate. This channel connects electrons from the source terminal to the drain terminal. The channel conductivity can be altered by varying the voltage applied to the gate terminal, enlarging or constricting the channel and thereby controlling the current flowing between the source and the drain.

FIG. 1 illustrates a FET 100 comprising a p-type substrate, and two spaced-apart n-type diffusion areas—one of which will serve as the "source", the other of which will serve as the "drain" of the transistor. The space between the two diffusion areas is the "channel". A thin dielectric layer is disposed over the substrate in the neighborhood of the channel, and a "gate" structure is disposed over the dielectric layer atop the channel. (The dielectric under the gate is also commonly referred to as "gate oxide" or "gate dielectric".) Electrical connections (not shown) may be made to tile source, the drain, and the gate. The substrate may be grounded.

Generally, when there is no voltage on the gate, there is no electrical conduction (connection) between the source and the drain. As voltage (of the correct polarity) is applied to the gate, there is a "field effect" in the channel between the source and the drain, and current can flow between the source and the drain, and can be controlled by the voltage applied to the gate. In this manner, a small signal (gate voltage) can control a relatively large signal (current flow between tile source and the drain).

The Floating Gate Transistor

A floating gate transistor is generally a transistor structure, broadly based on the FET, as described hereinabove. As illustrated in FIG. 2, the floating gate transistor 200 has a source and a drain, but rather than having only one gate, it has two gates which are called control gate (CG) and floating gate (FG). It is this arrangement of control gate and floating gate which enables the floating gate transistor to function as a memory cell, as described hereinbelow.

The floating gate is disposed over tunnel oxide (comparable to the gate oxide of the FET). The floating gate is a conductor, while the tunnel oxide is an insulator (dielectric material). Another layer of oxide (interpoly oxide, also a dielectric material) separates the floating gate from the control gate.

Since the floating gate is a conductor, and is surrounded by dielectric material, it can store a charge. Electrons can move around freely within the conductive material of the floating gate (which comports with tile basic definition of a "conductor").

Since the floating gate can store a charge, it can exert a field effect oil the channel region between the source and the drain, in a manner similar to how a normal FET works, as described hereinabove. Mechanisms for storing charges on the floating gate structure, as well as removing charges from the floating gate are described hereinbelow.

Generally, if a charge is stored on the floating gate, this represents a binary "1". If no charge is stored on the floating gate, this represents a binary "0". (These designations are arbitrary, and can be reversed so that the charged state represents binary "0" and the discharged state represents binary "1".) That represents the programming "half" of how a floating gate memory cell operates. The other half is how to determine whether there is a charge stored on the floating gate—in other words, to "read" the memory cell. Generally, this is done by applying appropriate voltages to the source, drain and gate terminals, and determining how conductive the channel is. Some modes of operation for a floating gate memory cell are described hereinbelow.

Normally, the floating gate non-volatile memory (NVM) cell has only a single "charge-storing area"—namely, the conductive floating gate (FG) structure, and can therefore only store a single bit of information (binary "1" or binary "0"). More recently, using a technology referred to as "multi-level cell" (MLC), two or more bits can be stored in and read from the floating gate cell.

The NROM Memory Cell

Another type of memory cell, called a "nitride, read only memory" (NROM) cell, has a charge-storage structure which is different from that of the floating gate memory cell and which permits charges to be stored in two separate charge-storage areas. Generally, the two separate charge storage areas are located within a non-conductive layer disposed between the gate and the underlying substrate, such as a layer of nitride formed in an oxide-nitride-oxide (ONO) stack underneath the gate. The non-conductive layer acts as a charge-trapping medium. Generally, electrical charges will stay where they are put in the charge-trapping medium, rather than being free to move around as in the example of the conductive floating gate of the floating gate memory cell. A first bit of binary information (binary "1" or binary "0") can be stored in a first portion (such as the left-hand side) of the charge-trapping medium, and a second bit of binary information (binary "1" or binary "0") can be stored in a second portion (such as the right-hand side) of the charge-trapping medium. An alternative viewpoint is that different charge concentrations can be considered for each bit of storage. Using MLC technology, at least two bits can be stored in and read from each of the two portions (charge storage areas) of the charge-trapping medium (for a total of 4 bits), similarly 3 bits or more than 4 bits may be identified.

FIG. 3 illustrates a basic NROM memory cell 300, which may be viewed as a FET with an "ONO" structure inserted between the gate and the substrate. (One might say that the ONO structure is "substituted" for the gate oxide of the FET.)

The ONO structure is a stack (or "sandwich") of bottom (lower) oxide 322, a charge-trapping material such as nitride 324, and a top (upper) oxide 326. The ONO structure may have an overall thickness of approximately 10-25 μm, such as 18 nm, as follows:

- the bottom oxide layer 322 may be from 3 to 6 nm, for example 4 nm thick;
- the middle nitride layer 324 may be from 3 to 8 nm, for example 4 nm thick; and
- the top oxide layer 326 may be from 5 to 15 nm, for example 10 nm thick.

The NROM memory cell has two spaced apart diffusions 314 and 316 (which can function as source and drain, as discussed hereinbelow), and a channel region 320 defined in the substrate 312 between the two diffusion regions 314 and 316, and a gate 328 disposed above the ONO stack 321.

In FIG. 3, the diffusions are labeled "N+". This means that they are regions in the substrate that have been doped with an electron donor material, such as phosphorous or arsenic. These diffusions are typically created in a larger region which is a p-type cell well (CW) doped with boron (or indium or both). This is the normal "polarity" for an NVM cell employing electron injection (but which may also employ hole injection, such as for erase). With opposite polarity (boron or indium implants in a n-type cell well), the primary injection mechanism would be for holes, which is generally accepted to be not as effective as electron injection. One skilled in the art will recognize that the concepts disclosed herein can be applied to opposite polarity devices.

The charge-trapping material 324 is non-conductive, and therefore, although electrical charges can be stored in the charge-trapping material, they are not free to move around, and they will generally stay where they are stored. Nitride is a suitable charge-trapping material. Charge trapping materials other than nitride may also be suitable for use as the charge-trapping medium. One such material is silicon dioxide with buried polysilicon islands. A layer (324) of silicon dioxide with polysilicon islands would be sandwiched between the two layers of oxide (322) and (326). Alternatively, the charge-trapping layer 324 may be constructed by implanting an impurity, such as arsenic, into a layer of silicon dioxide deposited on top of the bottom oxide 322.

The memory cell 300 is generally capable of storing at least two bits of data—at least one bit(s) in a first storage area of the nitride layer 324 represented by the dashed circle 323, and at least one bit(s) in a second storage area of the nitride layer 324 represented by the dashed circle 321. Thus, the NROM memory cell can be considered to comprise two "half cells", each half cell capable of storing at least one bit(s). It should be understood that a half cell is not a physically separate structure from another half cell in the same memory cell. The term "half cell", as it may be used herein, is used herein only to refer to the "left" or "right" bit storage area of the ONO stack (nitride layer). The storage areas 321, 323 may variously be referred to as "charge storage areas", "charge trapping areas", and the like, throughout this document. (The two charge storage areas may also be referred to as the right and left "bits".)

Each of the storage areas 321, 323 in the charge-trapping material 324 can exert a field effect on the channel region 320 between the source and the drain, in a manner similar to how a normal FET works, as described hereinabove (FIG. 2).

Generally, if a charge is stored in a given storage area of the charge-trapping material, this represents a binary "1", and if no charge is stored in a given storage area of the charge-trapping material, this represents a binary "0". (Again, these designations are arbitrary, and can be reversed so that the charged state represents binary "0" and the discharged state represents binary "1".) That represents the programming "half" of how an NROM memory cell operates. The other half is how to determine whether there is a charge stored in a given storage area of the charge-trapping material—in other words, to "read" the memory cell. Generally, this is done by applying appropriate voltages to the diffusion regions (functioning as source and drain) and gate terminals, and determining how conductive the channel is.

Generally, one feature of NROM cells is that rather than performing "symmetrical" programming and reading, NROM cells are beneficially programmed and read "asymmetrically", which means that programming and reading occur in opposite directions. The arrows labeled in FIG. 3 are arranged to illustrate this point. Programming may be performed in what is termed the "forward" direction and reading may be performed in what is termed the "opposite" or "reverse" direction.

"Reading" an NROM Cell

Reading an NROM memory cell may involve applying voltages to the terminals of the memory cell comparable to those used to read a floating gate memory cell, but reading may be performed in a direction opposite to that of programming. Generally, rather than performing "symmetrical" programming and reading (as is the case with the floating gate memory cell, described hereinabove), the NROM memory cell is usually programmed and read "asymmetrically", meaning that programming and reading occur in opposite directions. This is illustrated by the arrows in FIG. 3. Programming is performed in what is termed the forward direction and reading is performed in what is termed the opposite or reverse direction. For example, generally, to program the right storage area 323 (in other words, to program the right "bit"), electrons flow from left (source) to right (drain). To read the right storage area 323 (in other words, to read the right "bit"), voltages are applied to cause electrons to flow from right to left, in the opposite or reverse direction. For example, generally, to program the left storage area 321 (in other words, to program the left "bit"), electrons flow from right (source) to left (drain). To read the left storage area 321 (in other words, to read the left "bit"), voltages are applied to cause electrons to flow from left to right, in the opposite or reverse direction. See, for example, U.S. Pat. No. 6,768,165.

Memory Array Architecture, Generally

Memory arrays are well known, and comprise a plurality (many, including many millions) of memory cells organized (including physically arranged) in rows (usually represented in drawings as going across the page, horizontally, from left-to-right) and columns (usually represented in drawings as going up and down the page, from top-to-bottom).

As discussed hereinabove, each memory cell comprises a first diffusion (functioning as source or drain), a second diffusion (functioning as drain or source) and a gate, each of which has to receive voltage in order for the cell to be operated, as discussed hereinabove. Generally, the first diffusions (usually designated "source") of a plurality of memory cells are connected to a first bit line which may be designated "BL(n)", and second diffusions (usually designated "drain") of the plurality of memory cells are connected to a second bit line which may be designated "BL(n+1)". Typically, the gates of a plurality of memory cells are connected to common word lines (WL).

The bitlines may be "buried bitline" diffusions in the substrate, and may serve as the source/drain diffusions for the memory cells. The wordlines may be polysilicon structures and may serve as the gate elements for the memory cells.

FIG. 4 illustrates an array of NROM memory cells (labeled "a" through "i") connected to a number of word lines (WL) and bit lines (BL). For example, the memory cell "e" has its gate connected to WL(n), its source (left hand diffusion) is connected to BL(n), and its drain (right hand diffusion) is connected to BL(n+1). The nine memory cells illustrated in FIG. 4 are exemplary of many millions of memory cells that may be resident on a single chip.

Notice, for example that the gates of the memory cells "e" and "f" (to the right of "e") are both connected to the same word line WL(n). (The gate of the memory cell "d" to the left of "e" is also connected to the same word line WL(n).) Notice also that the right hand terminal (diffusion) of memory cell "e" is connected to the same bit line BL(n+1) as the left-hand terminal (diffusion) of the neighboring memory cell "f". In this example, the memory cells "e" and "f" have two of their three terminals connected together.

The situation of neighboring memory cells sharing the same connection—the gates of neighboring memory cells being connected to the same word line, the source (for example, right hand diffusion) of one cell being connected to the drain (for example left hand diffusion) of the neighboring cell—is even more dramatically evident in what is called "virtual ground architecture" wherein two neighboring cells actually share the same diffusion. In virtual ground array architectures, the drain of one memory cell may actually be the same diffusion which is acting as the source for its neighboring cell. Examples of virtual ground array architecture may be found in U.S. Pat. Nos. 5,650,959; 6,130,452; and 6,175,519, incorporated in their entirety by reference herein.

As described hereinabove, an NROM memory cell may have two spaced apart diffusions functioning as source and drain, depending on the operation (erase, program, read) being performed. For purposes of this description, the two diffusions may be referred by their orientation in an array, as either the "left" (or "left hand") diffusion and the "right" (or "right hand") diffusion. The drawings included herewith reflect these orientations.

In a semiconductor memory array architecture (including, but not limited to NROM), a plurality of memory cells may be arranged in rows (such as horizontal) and columns (such as vertical, or at 90 degrees to horizontal).

Bit Lines (BL, bitline) typically extend vertically through the array, and may optionally be "buried bitlines" (BB), meaning that they are formed within, rather than atop the silicon (wafer). Word Lines (WL, wordline) typically extend horizontally through the array, and may be formed optionally by polysilicon lines formed atop the surface of the wafer (atop underlying memory cell structure).

Typically, a given memory cell is connected by its two (left and right) diffusions to two adjacent bitlines, and by its gate to a single wordline. Many memory cells in a given row of the array may have their gates connected to a common wordline. Many memory cells in a given column of the array may have their left diffusion connected to a given bitline, and their right diffusion connected to another bitline.

In a typical virtual ground memory array architecture (including, but not limited to NROM), the right diffusion of a given memory cell may also be the left diffusion of an adjacent memory cell disposed immediately to the right of the given memory cell. And, that shared diffusion may run vertically through the array and function as a bitline for the two adjacent memory cells.

In a typical semiconductor memory array architecture (including, but not limited to NROM), a group of rows of memory cells, and associated wordlines, may be spaced apart from another group of rows of memory cells, and associated wordlines, leaving a "contact area" (or "contact region"). The regions populated by memory cells may be referred to as a "cell area" (or "cell region").

Generally, the purpose of the contact region, which is not populated with memory cells, is to provide an area, not populated by memory cells, where contacts can be formed between overlying interconnect lines, to the buried bitlines. For example, a cell region may comprise 32 rows of memory cells. In a memory cell array, there are typically many cell regions separated by many contact regions. Bitline resistance is an issue determining how many rows of memory cells can be between contact regions.

Bit line contacts are essentially vias (holes), formed through any structures or layers on the substrate, such as inter-layer dielectric (ILD), and filled with a conductive material, such as metal, so that connections may be made to the bitlines to control the operation of the memory cells in the array.

An issue being addressed by the present disclosure is dealing with misalignments which may occur when forming bitline contacts to bitlines.

Since the bitlines may be spaced very close together, it is known to provide silicon trench isolation (STI) between adjacent bitlines. Generally, STI is a trench formed in the surface of the silicon and filled with an insulating material, such as oxide. Therefore, if a contact is slightly misaligned, the misaligned portion of the contact falls on oxide, and will not be a problem.

A factor which is relevant to the present disclosure, as it relates to fabrication processes targeted at the memory array, is that generally, an overall memory array (or an integrated circuit (IC) chip which comprises a memory array) has what may be referred to as an "array area" and a "periphery area" (or "peripheral area"). The array area is that area (of the chip) which is populated by memory cells (cell region) and contacts (contact region), as described hereinabove. The periphery area contains control circuitry, typically CMOS, for operating the memory array and for interfacing the memory chip with an external system, including (for example), bond pads, buffers, registers and select circuitry. It is generally desirable that any fabrication (process) steps which are being performed in the array area are compatible with fabrication (process) steps which are being performed in the periphery area.

FIG. 4A illustrates, very generally, an exemplary overall physical layout of a NVM memory chip 450 having two distinct areas—a first "Array" area (generally designated "452") which contains the memory cells, wordlines, and bitlines (such as schematically illustrated in FIG. 4), and a second "CMOS" area (generally designated "454"; also referred to as "periphery" area) containing control circuits (not shown) which exercise control over the individual memory cells via the wordlines and bitlines connecting the memory cells. The Array Area 452 may be split into two Array Areas 452a and 452b, with a narrow CMOS area 454a extending vertically between the two Array Areas, and connecting to wordlines horizontally traversing the Array Areas. A region 454b of CMOS circuitry may be arranged horizontally across the top(s) of the Array Area(s), for connecting to the top ends of the bitlines. Another region 454c of CMOS circuitry may be arranged horizontally across the bottom(s) of the Array Area(s), for connecting to the bottom ends of the bitlines. Input and Output circuitry, buffers and bond pads may be disposed in the CMOS area for interfacing the memory clip to an external system (not shown). Generally, the purpose of this figure is simply to show that CMOS circuitry is typically implemented on the same integrated circuit (IC) chip as the memory cells and array, and therefore, processes which affect one (such as CMOS) may affect the other (Array).

Contact Etch Stop Layer (CESL)

FIG. 1 (FET), FIG. 2 (floating gate) and FIG. 3 (NROM), above, are somewhat stylized, omitting various common elements for the sake of illustrative clarity.

For example, a thin layer of metal silicide, such as cobalt silicide or titanium silicide or nickel silicide, may be formed atop the gate structure, and atop the source and drain diffusions (or two "agnostic" diffusions of an NROM cell). A dielectric layer may then be disposed over the entire device, to support upper level metalization such as wiring patterns, interconnects, word lines and bitlines which pass between several devices, as well as to external circuitry (not shown). This dielectric layer may be referred to as an inter level dielectric (ILD) layer.

Contacts must be opened through the ILD, to access the metal silicide, and effect contact with the gate (such as 328) and the two diffusions (such as 314 and 316). With reference to the diffusions, it is particularly important that, in the process of creating the contact, the underlying diffusion is not damaged. It is thereby known, and is common practice to first form a capping layer over the device, and said capping layer may act as an etch stop layer when etching the ILD to form the contacts.

The etch stop layer may be referred to hereinafter as a contact etch stop layer (CESL), and normally comprises material with good etch selectivity between the material and the Inter Layer Dielectric (ILD) through which the contact opening must be made. Nitride is an example of such a material.

Commonly-owned patents disclose structure and operation of NROM and related ONO memory cells. Some examples may be found in commonly-owned U.S. Pat. Nos. 5,768,192 and 6,011,725, 6,649,972 and 6,552,387.

Commonly-owned patents disclose architectural aspects of an NROM and related ONO array, (some of which have application to other types of NVM array) such as segmentation of the array to handle disruption in its operation, and symmetric architecture and non-symmetric architecture for specific products, as well as the use of NROM and other NVM array(s) related to a virtual ground array. Some examples may be found in commonly-owned U.S. Pat. Nos. 5,963,465, 6,285,574 and 6,633,496.

Commonly-owned patents also disclose additional aspects at the architecture level, including peripheral circuits that may be used to control an NROM array or the like. Some examples may be found in commonly-owned U.S. Pat. Nos. 6,233,180, and 6,448,750.

Commonly-owned patents also disclose several methods of operation of NROM and similar arrays, such as algorithms related to programming, erasing, and/or reading such arrays. Some examples may be found in commonly-owned U.S. Pat. Nos. 6,215,148, 6,292,394 and 6,477,084.

Commonly-owned patents also disclose manufacturing processes, such as the process of forming a thin nitride layer that traps hot electrons as they are injected into the nitride layer. Some examples may be found in commonly-owned U.S. Pat. Nos. 5,966,603, 6,030,871, 6,133,095 and 6,583,007.

Commonly-owned patents also disclose algorithms and methods of operation for each segment or technological application, such as: fast programming methodologies in all flash memory segments, with particular focus on the data flash segment, smart programming algorithms in the code flash and EEPROM segments, and a single device containing a combination of data flash, code flash and/or EEPROM. Some examples may be found in commonly-owned U.S. Pat. Nos. 6,954,393 and 6,967,896.

Where applicable, descriptions involving NROM are intended specifically to include related oxide-nitride technologies, including SONOS (Silicon-Oxide-Nitride-Oxide-Silicon), MNOS (Metal-Nitride-Oxide-Silicon), MONOS (Metal-Oxide-Nitride-Oxide-Silicon) and the like used for NVM devices. Further description of NVM and related technologies may be found at "Non Volatile Memory Technology", 2005 published by Saifun Semiconductor; "Microchip Fabrication", by Peter Van Zant, $5^{th}$ Edition 2004; "Application-Specific Integrated Circuits" by Michael John Sebastian Smith, 1997; "Semiconductor and Electronic Devices", by Adir Bar-Lev, $2^{nd}$ Edition, 1999; "Digital Integrated Circuits" by Jan M. Rabaey, Anantha Chandrakasan and Borivoje Nikolic, $2^{nd}$ Edition, 2002 and materials presented at and through http://siliconnexus.com, "Design Considerations in Scaled SONOS Nonvolatile Memory Devices" found at: http://klabs.org/richcontent/MemoryContent/nvmt_symp/nvmts_2000/presentations/bu_white_sonos_lehigh_univ.pdf, "SONOS Nonvolatile Semiconductor Memories for Space and Military Applications" found at: http://kliabs.org/richcontent/MemoryContent/nvmt_symp/nvmts_2000/papers/adams_d.pdf, "Philips Research—Technologies—Embedded Nonvolatile Memories" found at: http://www.research.philips.com/technologies/ics/nvmemories/index.html, and "Semiconductor Memory: Non-Volatile Memory (NVM)" found at: http://www.ece.nus.edu.sg/stfpage/elezhucx/myweb/NVM.pdf, all of which are incorporated by reference herein in their entirety.

GLOSSARY

Unless otherwise noted, or as may be evident from the context of their usage, any terms, abbreviations, acronyms or scientific symbols and notations used herein are to be given their ordinary meaning in the technical discipline to which the disclosure most nearly pertains. The following terms, abbreviations and acronyms may be used throughout the descriptions presented herein and should generally be given the following meaning unless contradicted or elaborated upon by other descriptions set forth herein. Some of the terms set forth below may be registered trademarks (®).

anisotropic literally, one directional. An example of an anisotropic process is sunbathing. Only surfaces of the body exposed to the sun become tanned. (see "isotropic").

array memory cells may optionally be organized in an array of rows and columns, and may be connected to selected bit lines and word lines in the array. The array may physically be divided into various sections, which may be referred to as:

Array Area (AA)—memory cells, bit lines, word lines, contacts to bit lines and word lines Cell Area—portion of the Array Area which comprises memory cells Contact Area—a portion of the AA devoid of memory cells (and word lines) to allow for BL contacts.

Periphery Area—a portion of the memory chip, adjacent or surrounding the Array Area, comprising control circuitry, typically CMOS, for operating the Array bit The word "bit" is a shortening of the words "binary digit." A bit refers to a digit in the binary numeral system (base 2). A given bit is either a binary "1" or "0". For example, the number 1001011 is 7 bits long. The unit is sometimes abbreviated to "b". Terms for large quantities of bits can be formed using the standard range of prefixes, such as kilobit (Kbit), megabit (Mbit) and gigabit (Gbit). A typical unit of 8 bits is called a Byte, and the basic unit for 128 Bytes to 16K Bytes is treated as a "page". That is the "mathematical" definition of "bit". In some cases, the actual (physical) left and right charge storage areas of an NROM cell are conveniently referred to as the left "bit" and the right "bit", even though they may store more than one binary bit (with MLC, each storage area can store at least two binary bits). The intended meaning of "bit" (mathematical or physical) should be apparent from the context in which it is used.

BL short for bit line. The bit line is a conductor connected to the drain (or source) of a memory cell transistor.

byte A byte is commonly used as a unit of storage measurement in computers, regardless of the type of data being stored. It is also one of the basic integral data types in many programming languages. A byte is a contiguous sequence of a fixed number of binary bits. In recent years, the use of a byte to mean 8 bits is nearly ubiquitous. The unit is sometimes abbreviated to "B". Terms for large quantities of Bytes can be formed using the standard range of prefixes, for example, kilobyte (KB), megabyte (MB) and gigabyte (GB).

cap a term used to describe layers of a material disposed over another, dissimilar material, typically to protect the underlying material from damage during subsequent processing steps. A cap may be left in place, or removed, depending upon the situation.

Cell Well (CW) the cell well is an area in the silicon substrate that is prepared for functioning as a transistor or memory cell device by doping with an electron acceptor material such as boron or indium (p, electron acceptors or holes) or with an electron donor material such as phosphorous or arsenic (n, electron donors). The depth of a cell well is defined by the depth of the dopant distribution.

CMOS short for complementary metal oxide semiconductor. CMOS consists of n-channel and p-channel MOS transistors. Due to very low power consumption and dissipation as well as minimization of the current in "off" state, CMOS is a very effective device configuration for implementation of digital functions. CMOS is a key device in state-of-the-art silicon microelectronics.

CMOS Inverter: A pair of two complementary transistors (a p-channel and an n-channel) with the source of the n-channel transistor connected to the drain of the p-channel transistor and the gates connected to each other. The output (drain of the p-channel transistor) is high whenever the input (gate) is low and the other way round. The CMOS inverter is the basic building block of CMOS digital circuits.

NMOS: n-channel CMOS.

PMOS: p-channel CMOS.

CMP short for chemical-mechanical polishing. CMP is a process, using both chemicals and abrasives, comparable to lapping, for removing material from a built up structure, resulting in a particularly planar resulting structure.

Dopant element introduced into semiconductor to establish either p-type (acceptors) or n-type (donors) conductivity; common dopants in silicon: p-type, boron, B, Indium, In; n-type phosphorous, P, arsenic, As, antimony, Sb.

EEPROM short for electrically erasable, programmable read only memory. EEPROMs have the advantage of being able to selectively erase any part of the chip without the need to erase the entire chip and without the need to remove the chip from the circuit. The minimum erase unit is 1 Byte and more typically a full Page. While an erase and rewrite of a location appears nearly instantaneous to the user, the write process is usually slightly slower than the read process; the chip can usually be read at full system speeds.

EPROM short for erasable, programmable read only memory. EPROM is a memory cell in which information (data) can be erased and replaced with new information (data).

Erase a method to erase data on a large set of bits in the array, such as by applying a voltage scheme that inject holes or remove electrons in the bit set. This method causes all bits to reach a low Vt level.

FET short for field effect transistor. The FET is a transistor that relies on an electric field to control the shape and hence the conductivity of a "channel" in a semiconductor material. FETs are sometimes used as voltage-controlled resistors. The terminals of FETs are called gate, drain and source.

isotropic literally, identical in all directions. An example of an isotropic process is dissolving a tablet in water. All exposed surfaces of the tablet are uniformly acted upon. (see "anisotropic")

mask a layer of material which is applied over an underlying layer of material, and patterned to have openings, so that the underlying layer can be processed where there are openings. After processing the underlying layer, the mask may be removed. Common masking materials are photoresist and nitride. Nitride is usually considered to be a "hard mask".

MOS short for metal oxide semiconductor.

MOSFET short for metal oxide semiconductor field-effect transistor. MOSFET is by far the most common field-effect transistor in both digital and analog circuits. The MOSFET is composed of a channel of n-type or p-type semiconductor material, and is accordingly called an NMOSFET or a PMOSFET. (The 'metal' in the name is an anachronism from early chips where gates were metal; modern chips use polysilicon gates, but are still called MOSFETs).

nitride commonly used to refer to silicon nitride (chemical formula Si3N4). A dielectric material commonly used in integrated circuit manufacturing. Forms an excellent mask (barrier) against oxidation of silicon (Si). Nitride is commonly used as a hard mask or, in the case of an NVM memory cell having an ONO layer as a charge-trapping material.

n-type semiconductor in which concentration of electrons is higher than the concentration of "holes". See p-type.

NROM short for nitride read only memory.

NVM short for non-volatile memory. NVM is computer memory that can retain the stored information even when not powered. Examples of non-volatile memory include read-only memory, flash memory, most types of magnetic computer storage devices (for example hard disks, floppy disk drives, and magnetic tape), optical disc drives, and early computer storage methods such as paper tape and punch cards. Non-volatile memory is typically used for the task of secondary storage, or long-term persistent storage. The most widely used form of primary storage today is a volatile form of random access memory (RAM), meaning that when the computer is shut down, anything contained in RAM is lost. Unfortunately most forms of non-volatile memory have limitations which make it unsuitable for use as primary storage. Typically non-volatile memory either costs more or performs worse than volatile random access memory. (By analogy, the simplest form of an NVM memory cell is a simple light switch. Indeed, such a switch can be set to one of two (binary) positions, and "memorize" that position.)

ONO short for oxide-nitride-oxide. ONO is used as a charge storage insulator consisting of a sandwich of thermally insulating oxide, and charge-trapping nitride.

oxide commonly used to refer to silicon dioxide (SiO2). Also known as silica. SiO2 is the most common insulator in semiconductor device technology, particularly in silicon MOS/CMOS where it is used as a gate dielectric (gate oxide); high quality films are obtained by thermal oxidation of silicon. Thermal SiO2 forms a smooth, low-defect interface with Si, and can be also readily deposited by CVD. Some particular applications of oxide are:

LV Oxide short for low voltage oxide. LV refers to the process used to deposit the oxide.

HV Oxide short for high voltage oxide. HV refers to the process used to deposit the oxide.

STI Oxide short for shallow trench oxide. Oxide-filled trenches are commonly used to separate one region (or device) of a semiconductor substrate from another region (or device).

poly short for polycrystalline silicon (Si). Heavily doped poly Si is commonly used as a gate contact in silicon MOS and CMOS devices.

p-type semiconductor in which concentration of "holes" is higher than the concentration of electrons. See n-type. Examples of p-type silicon include silicon doped (enhanced) with boron (B), Indium (In) and the like.

resist short for photoresist; also abbreviated "PR". Photoresist is often used as a masking material in photolithographic processes to reproduce either a positive or a negative image on a structure, prior to etching (removal of material which is not masked). PR is usually washed off after having served its purpose as a masking material.

ROM short for read-only memory.

salicide The term salicide refers to a technology used in the microelectronics industry for the purpose of reducing the sheet resistance of the exposed silicon and poly-silicon areas. The salicide process involves the reaction of a thin metal film with silicon ultimately forming a metal silicide through a series of annealing and/or etch processes. The term "salicide" is a compaction of the phrase self-aligned silicide. The description "self-aligned" suggests that the silicide formation does not require lithographic patterning processes, as opposed to a non-aligned technology such as polycide. The term salicide is also used to refer to the metal silicide formed by the contact formation process, such as "titanium salicide", although this usage is inconsistent with accepted naming conventions in chemistry. The salicide process may begin with deposition of a thin transition metal layer over fully formed and patterned semiconductor devices (such as transistors). The wafer is heated, allowing the transition metal to react with exposed silicon (such as source, drain, gate) forming a low-resistance transition metal silicide. The transition metal does not react with the silicon oxide and or nitride insulators present on the wafer. Following the reaction, any remaining transition metal is removed by chemical etching, leaving silicided silicon. The silicided silicon is then further heat treated to form a lower resistance silicide.

sector a part of the array, usually larger than a page, which usually contains a few pages. A minimum erase might include a sector.

self-aligned In fabrication of MOSFETs on integrated circuits, a self-aligned gate is an arrangement where the edges of the source and drain doping regions next to the gate are defined by the same mask that defines the edges of the gate next to the source and drain regions. An overlap between the source, drain and gate regions would be difficult to achieve without the self-aligned feature (due to the inherent misalignment between different masking layers). "Self-aligned" may also refer to any process step where a previously-formed structure acts as a mask for a subsequent process step, such as deposition or etching.

Si Silicon, a semiconductor.

SONOS Si-Oxide-Nitride-Oxide-Si, another way to describe ONO with the Si underneath and the Poly gate on top.

spacer a spacer, as the name implies, is a material (such as a layer of oxide) disposed on an element (such as a poly gate electrode). For example, sidewall spacers disposed on opposite sides of a gate electrode structure cause subsequent implants to occur further away from the gate than otherwise (without the spacers in place), thereby controlling (increasing) the length of a channel under the gate electrode structure.

Units of Length Various units of length may be used herein, as follows:

meter (m) A meter is the S1 unit of length, slightly longer than a yard.

1 meter=~39 inches. 1 kilometer (km)=1000 meters=~0.6 miles. 1,000,000 microns=1 meter. 1,000 millimeters (mm)=1 meter.

100 centimeters (cm)=1 meter.

micron (μm) one millionth of a meter (0.000001 meter); also referred to as a micrometer.

mil ⅟₁₀₀₀ or 0.001 of an inch; 1 mil=25.4 microns nanometer (nm) one billionth of a meter (0.000000001 meter).

Angstrom (Å) one tenth of a billionth of a meter. 10 Å=1 nm.

word line or wordline, (WL). A conductor normally connected to the gate of a memory cell transistor. The wordline may actually be the gate electrode of the memory cell.

In addition to the above, some abbreviations that may be used herein, or in a provisional application from which this non-provisional application claims priority, include:

Active Area—the area outside the STI (or field area).
BB short for buried bitline.
CESL short for Contact Etch Stop Layer.
CT short for contact.
DEP short for deposition.
ILD short for inter-layer dielectric
Ld Ld is a term given to a minimal geometry feature supported by the technology.
SAC short for self-aligned contact.
STI short for silicon trench isolation.

BRIEF DESCRIPTION

Summary

Generally, improved techniques for forming silicon trench isolation (STI) between adjacent bitlines in a memory array are disclosed Features of the various embodiments disclosed herein may include that the STI is formed late in the process, is self-aligned to the bitlines, and that the trenches may be filled with inter-layer dielectric (ILD).

According to an embodiment of the disclosure, a semiconductor device comprises: spaced-apart diffusions; and a self-aligned silicon trench isolation between adjacent diffusions. The diffusions include, but are not limited to, silicides, metals, raised or buried diffusions. The STI may be formed after forming the diffusions, and is self-aligned to the diffusions. The diffusions may comprise bitlines; and the semiconductor device comprises a memory array.

According to an embodiment of the disclosure, a method of forming self-aligned silicon trench isolation between adjacent diffusions in a semiconductor device such as in an array of memory cells comprises: forming bitlines; and forming silicon trench isolation (STI) between adjacent bitlines; wherein the STI is formed after forming the bitlines and is self-aligned to the bitlines. The bitlines may include but are not limited to silicides, metals, raised or buried bitlines. Bitline oxides may be formed over the bitlines; and the bitline oxides may be used to self-align trenches of the STI to the bitlines.

According to some features of the disclosure, trenches of the STI may be lined with a CMOS spacer, salicide blocking layer and/or a contact etch stop layer.

According to some features of the disclosure, the memory cells may formed using a dual poly process (DPP) comprising buried bitlines (BBs), wherein a first poly (Poly-1) deposited on an oxide-nitride-oxide (ONO) layer delineates the bitlines, oxide deposited over the bit lines is planarized, and a second poly (Poly-2) patterned along with the underlying first poly (Poly-1) defines word lines; and the STI may be formed after Poly-2 etch or after word line salicidation.

According to an embodiment of the disclosure, an array of memory cells comprises: a plurality of bitlines extending through a contact area in the array; silicon trench isolation (STI) trenches disposed in the contact area, and self-aligned between adjacent bitlines; memory devices connected between the bitlines in a cell area adjacent to the contact area; and inter-level dielectric covering the memory devices and filling the STI trenches. The bitlines may be buried bitlines.

Generally, the purpose of the STI in a memory array disclosed herein is to prevent misaligned bitline (BL) contacts from contacting silicon outside of the corresponding bitlines.

Advantages of the techniques for forming STI in a memory array disclosed herein include, but are not limited to:
the STI is self-aligned to the bitlines
the STI trench depth and morphology (shape) is independent of STI which is formed in the CMOS periphery
the bit line contact, if misaligned, will not contact the underlying silicon
The contact to the bitlines may, optionally, be made larger to overlap the self aligned STI thereby ensuring full coverage of the contact by the bitlines.
Full coverage of the contacts by the bitlines may, if necessary, eliminate the use of an additional mask to implant into the contacts.

The techniques disclosed herein may be applicable to most non-volatile memory (NVM) devices including, but not limited to, NROM (sometimes referred to as Nitride Read Only Memory), SONOS (Semiconductor Oxide Nitride Oxide Semiconductor; Silicon-Oxide-Nitride-Oxide-Silicon), SANOS (Silicon-Aluminum Oxide-Nitride-Oxide-Silicon), MANOS (Metal-Aluminum Oxide-Nitride-Oxide-Silicon), TANOS (Tantalum-Aluminum Oxide-Nitride-Oxide-Silicon) and Floating Gate (FG) devices.

BRIEF DESCRIPTION OF THE DRAWING(S)

Reference will be made in detail to embodiments of the disclosure, examples of which may be illustrated in the accompanying drawing figures (FIGs). The figures are intended to be illustrative, not limiting. Although the disclosure is generally described in the context of these embodiments, it should be understood that it is not intended to limit the disclosure to these particular embodiments.

Certain elements in selected ones of the figures may be illustrated not-to-scale, for illustrative clarity. The cross-sectional views, if any, presented herein may be in the form of "slices", or "near-sighted" cross-sectional views, omitting certain background lines which would otherwise be visible in a true cross-sectional view, for illustrative clarity. In some cases, hidden lines may be drawn as dashed lines (this is conventional), but in other cases they may be drawn as solid lines.

If shading or cross-hatching is used, it is intended to be of use in distinguishing one element from another (such as a cross-hatched element from a neighboring un-shaded element). It should be understood that it is not intended to limit the disclosure due to shading or cross-hatching in the drawing figures.

Elements of the figures may (or may not) be numbered as follows. The most significant digits (hundreds) of the reference number correspond to the figure number. For example, elements of FIG. 1 are typically numbered in the range of 100-199, and elements of FIG. 2 are typically numbered in the range of 200-299. Similar elements throughout the figures may be referred to by similar reference numerals. For example, the element 199 in FIG. 1 may be similar (and possibly identical) to the element 299 in FIG. 2. Throughout the figures, each of a plurality of elements 199 may be referred to individually as 199*a*, 199*b*, 199*c*, etc. Such relationships, if any, between similar elements in the same or different figures will become apparent throughout the specification, including, if applicable, in the claims and abstract.

Throughout the descriptions set forth in this disclosure, lowercase numbers or letters may be used, instead of subscripts. For example Vg could be written $V_g$. Generally, lowercase is preferred to maintain uniform font size. Regarding the use of subscripts (in the drawings, as well as throughout the text of this document), sometimes a character (letter or numeral) is written as a subscript—smaller, and lower than the character (typically a letter) preceding it, such as "$V_s$" (source voltage) or "$H_2O$" (water). For consistency of font size, such acronyms may be written in regular font, without subscripting, using uppercase and lowercase—for example "Vs" and "H2O".

Conventional electronic components may be labeled with conventional schematic-style references comprising a letter (such as A, C, Q, R) indicating the type of electronic component (such as amplifier, capacitor, transistor, resistor, respectively) followed by a number indicating the iteration of that element (such as "1" meaning a first of typically several of a given type of electronic component). Components such as resistors and capacitors typically have two terminals, which may be referred to herein as "ends". In some instances, "signals" are referred to, and reference numerals may point to lines that carry said signals. In the schematic diagrams, the various electronic components are connected to one another, as shown. usually, lines in a schematic diagram which cross over one another and where there is a dot at the intersection of the two lines are connected with one another, else (if there is no dot at the intersection) they are typically not connected with one another.

FIG. 1 is a stylized cross-sectional view of a field effect transistor (FET), according to the prior art. To the left of the figure is a schematic symbol for the FET.

FIG. 2 is a stylized cross-sectional view of a floating gate memory cell, according to the prior art. To the left of the figure is a schematic symbol for the floating gate memory cell.

FIG. 3 is a stylised cross-sectional view of a two bit NROM memory cell of the prior art. To the left of the figure is a schematic symbol for the NROM memory cell.

DETAILED DESCRIPTION

The disclosure is generally directed to techniques for forming silicon trench isolation (STI) that are self-aligned to adjacent bitlines diffusions in a semiconductor device. The diffusions include, but are not limited to, silicides, metals, raised or buried diffusions. For convenience and clarity of presentation, the diffusions in the exemplary embodiments are bitlines (BL) and the semiconductor device is a memory array. Two exemplary embodiments are disclosed. It should be understood that various process steps both before and after STI formation (and filling) are disclosed, in order to provide a context for the embodiments discussed herein, and these additional pre- and post-STI process steps should not be interpreted as limiting the disclosure to the specific examples which are discussed.

For example, the process of forming and filling STI trenches is described in greater detail hereinbelow in the context of a "dual poly process" (DPP) for forming memory arrays with buried bitlines (BBs), wherein a first poly (Poly-1) deposited on ONO delineates the bit lines. Generally, in DPP, oxide deposited over the bit lines is planarized, and a second poly (Poly-2) patterned along with the underlying Poly-1 defines the word lines.

An Embodiment of an STI Process

According to an embodiment of the disclosure, silicon trench isolation (STI) between adjacent bitlines is formed, self-aligned to the bitlines, after Poly-2 wordline etch. Generally, in the past, the STI is formed at Active Mask and is not self-aligned to the Bit Line.

Figure 4:
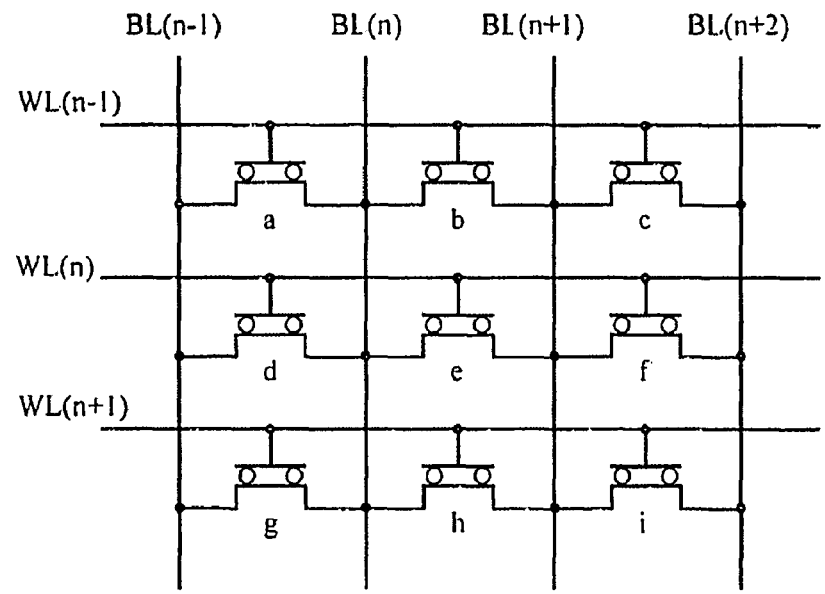
FIG. 4 is a diagram of a memory cell array with NROM memory cells, according to the prior art.
Figure 4A:
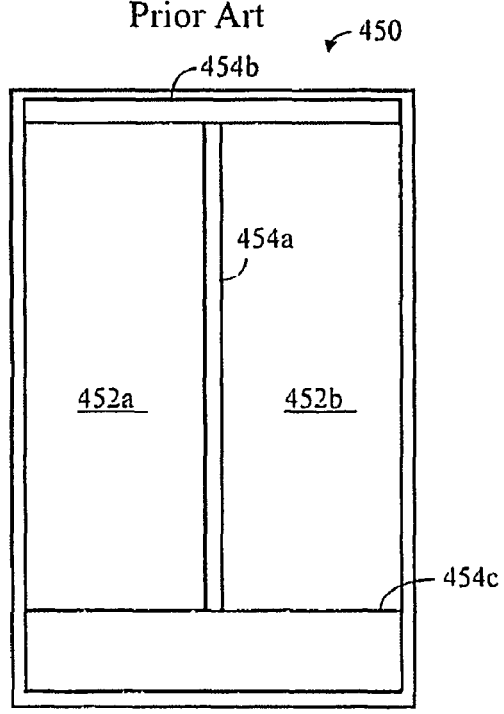
FIG. 4A is a plan view of a memory chip, according to the prior art.
Figure 5:
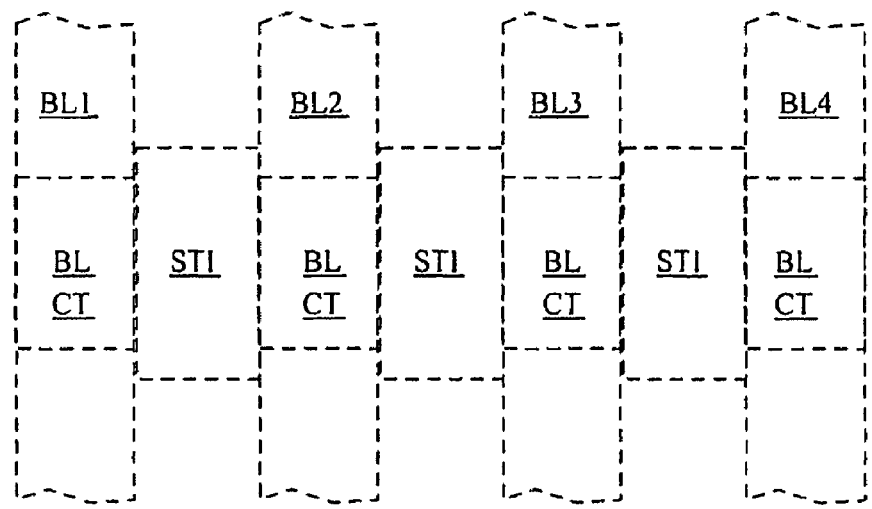
FIG. 5 is a diagram of a contact region in a memory array, such as may be formed according to this disclosure.

FIG. 5 illustrates, generally, a contact region in a memory array comprising a plurality (four shown) of bitlines (labeled BL1 ... BL4) extending vertically and spaced horizontally from one another. By way of example, the bitlines may each have a width (in the horizontal direction) of 60 nm, and may be spaced 100 nm apart from one another.

A bitline contact (BLCT) will extend through inter-layer dielectric (ILD, not shown, described hereinbelow) to each of the bitlines BL1 ... BL4, and may all be at a given, uniform vertical position oil the bitline, as illustrated. The bitline contacts BLCT may have an exemplary same width (horizontal dimension) as the bitlines BL1 ... BL4—for example, 60 nm. Optionally, the widths may be made larger to overlap the self aligned STI thereby ensuring full coverage of the contact by the bitlines. The full coverage of the contacts by the bitlines may, if necessary, eliminate the use of an additional mask to implant into the contacts. The vertical extent of the bitline contacts may, if necessary, be made larger as, for example, 90 nm.

The vertical extent of the contact region is generally determined by an array uniformity requirement. Optionally, two wordlines may be removed to allow for the contact placement, and the vertical dimension is established accordingly.

In case a bitline contact is misaligned (horizontally) with the corresponding bitline, it may extend over silicon between the bitlines, which is not desirable, since that may cause leakage (bitline-to-bitline leakage). Since the bitline contacts are not self-aligned, in case there is a mask alignment deviation, many bitline contacts may be misaligned with their corresponding bitlines. One known option is to provide silicon-trench isolation (STI) between the bitlines, in the contact region, so that misaligned portions of bitline contact(s) will "land" on insulator, without causing bitline-to-bitline leakage.

Typically, the bit line width is less than or equal to the minimum allowable (process & photolithography wise) contact width.

FIG. 5 illustrates that silicon trench isolation (STI) may be formed between each of the adjacent bitlines, such as between BL1 and BL2, between BL2 and BL3, and between BL3 and BL4. The STI may be oxide (an insulating material) disposed in a trench formed between the adjacent bitlines. The trench (and the subsequent STI) may have optionally the same width (horizontal dimension) as the spacing between the bitlines, and is at substantially the same vertical position as the bitline contacts, and should extend vertically beyond the bitline contacts to ensure that any misaligned portion of a bitline contact will "land" on STI, rather than on silicon, thereby maintaining isolation of adjacent bitlines. The STI trenches may optionally not extend all the way between the wordlines bordering the contact region.

In FIG. 5, the bitlines, bitline contacts and STI are shown in dashed lines, since they are not yet formed. This figure simply represents, at the "Active Mask" level, the general layout of these elements in the contact region. In the prior art, the STI is already formed at this Active Mask level, and is filled (with oxide) shortly thereafter. The bitlines and bitline contacts are formed later.

According to this embodiment of the disclosure, the STI is formed later in the process, and is self-aligned to the bitlines.

Typically, at the Active Mask level, the STI trench depth in the Array is deep because it is determined by CMOS requirements. Later in the process, the STI trench depth is independent of CMOS requirements and can be made shallower. Generally, a shallower trench depth is easier to fill than a deep one. This is a benefit of the present disclosure, although the STI trench depth could be made shallow in the array (at the active mask level) if one were to use a separate active mask to etch the STI in the array and another active mask to etch STI in the periphery.

Figure 6:
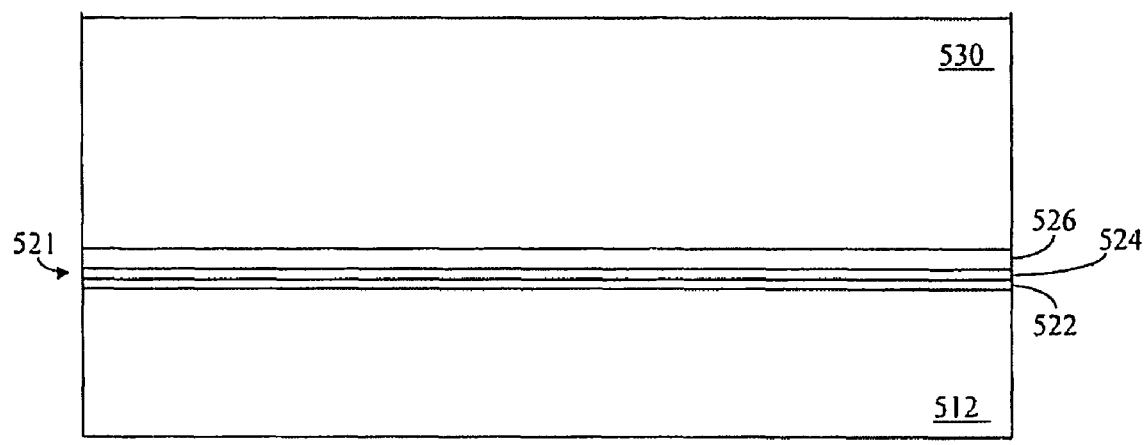
FIG. 6 is a cross-sectional view of a memory array (or a portion thereof) illustrating a first step of an overall process of forming a memory array, according to an embodiment of this disclosure.

FIG. 6 illustrates a first step (Deposit ONO and Poly-1) in the overall process of forming a memory array, with STI-bordered Array Contacts (or "bitline contacts", BLCT).

An ONO stack 521 (compare 321) comprising a bottom (lower) oxide layer 522 (compare 322), a layer 524 (compare 324) of charge-trapping material such as nitride, and a top (upper) oxide layer 526 (compare 326) is deposited on a substrate 512 (compare 312). The ONO stack 521 may have an overall thickness of approximately 10-50 nm, such as 18 nm, as follows:

the bottom oxide layer 522 may be from 3 to 10 nm, for example 4 nm thick;
the middle nitride layer 524 may be from 3 to 12 nm, for example 4 nm thick; and
the top oxide layer 526 may be from 5 to 25 nm, for example 10 nm thick.

Optionally ONO 512 may be etched (removed) from the periphery (CMOS) area (not shown, compare 454). Generally, ONO 521 will cover the array.

A first layer 530 of polysilicon ("poly"; "Poly-1") may be deposited, to a thickness of approximately 10-250 nm, such as 50 nm, over the ONO 521.

Figure 7:
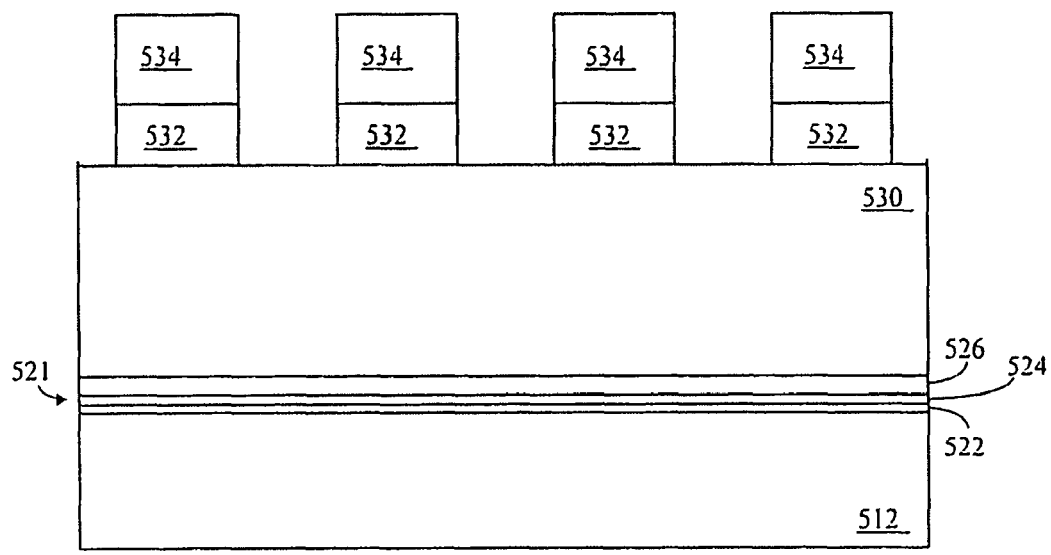
FIGS. 7-13 are cross-sectional views of subsequent steps of the overall process of forming a memory array, according to this disclosure.

FIG. 7 illustrates a next step (Poly 1 Array Mask) in the overall process of forming a memory array, with STI-bordered Array Contacts. A layer of nitride 532 is deposited over the poly 530, photoresist 534 is deposited and patterned (over the nitride 532), the nitride 532 is etched to form a hard mask 532, and the resist 534 is removed (stripped not shown), leaving the nitride hard mask 532.

Figure 8:
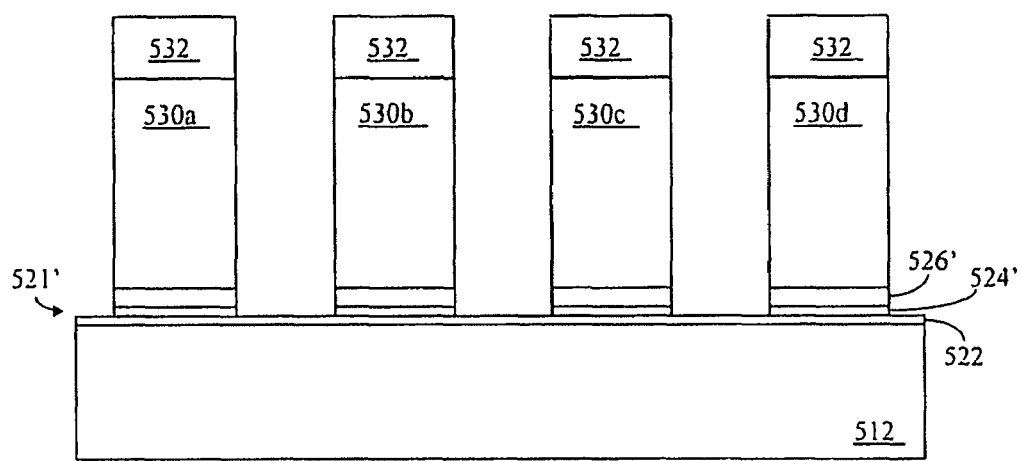

FIG. 8 illustrates a next step (Etch Poly-1 and ONO) in the overall process of forming a memory array, with STI-bordered Array Contacts. The poly 530 (Poly-1) is etched, using the nitride hard mask 532 stopping on the top oxide 526 of the ONO stack 521. This results in individual poly structures (or "lines") 530a, 530b, 530c and 530d (which may generally be referred to as "530"), as shown, each of which has underneath it a segment of the original ONO stack 521 (now labeled 521' (prime)), wherein the top oxide layer is labeled 526' (prime), and the nitride layer is labeled 524' (prime). The Poly-1 structures 530 may have an exemplary width of 100 nm, an exemplary height of 50 nm, and may be spaced 60 nm apart from one another.

Then, the top oxide 526 and nitride 524 of the ONO stack 521 are etched, in the spaces (gaps) between the Poly-1 structures 530, stopping on the bottom oxide 522. The original bottom oxide layer 522, now exposed between the poly structures 530, may be unaffected.

Figure 11:
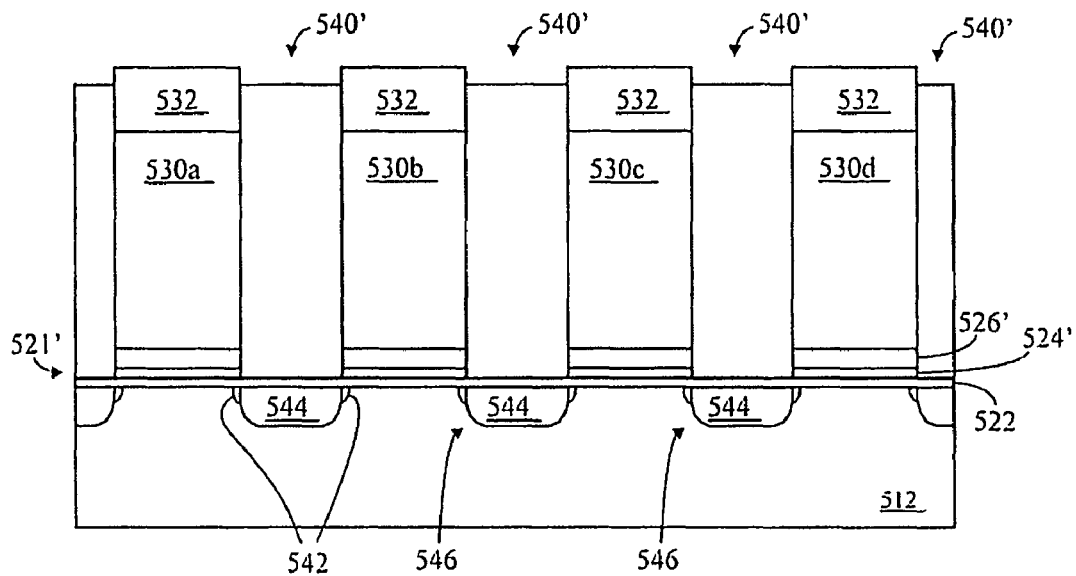

The nitride 532, now thinned, may be left in place to act as an etch stop for a subsequent CMP process (see FIG. 11).

A reason for leaving the bottom oxide 522 in place is to protect the underlying silicon 512. Optionally, a thin layer of oxide (not shown) may be grown to protect exposed silicon and "heal" the etch damage.

Figure 9:
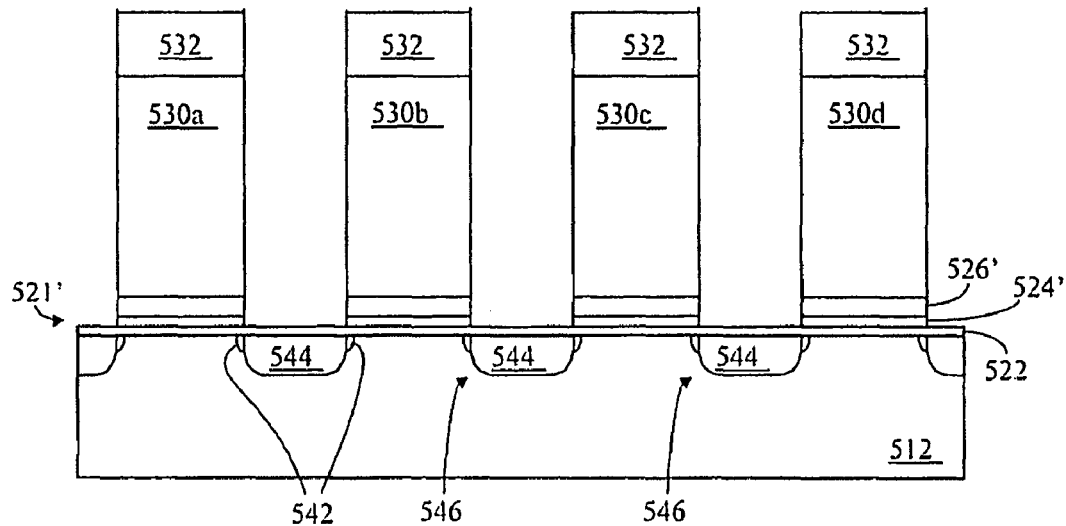

FIG. 9 illustrates a next step (Bit Line Implant) in the overall process of forming a memory array, with STI-bordered Array Contacts. A pocket implant 542 may optionally be formed, followed by a bit line implant 544. Some exemplary process parameters are:

for the pocket implant 542, $0.5-6 \times 10^{13}$/cm2 (dose of the dopant per unit area) and energy of 10-20 Kev, no tilt, boron (B), although the scope of the disclosure is not limited in this respect.
for the bitline implant 544, $1.0-1.5E^{15}$ cm2, 10-20 Kev, Arsenic (As), through the ONO Bottom Oxide, although the scope of the disclosure is not limited in this respect.

The resulting "buried bitline" 546, comprising pocket implant 542 and 544 is situated substantially in the space between adjacent poly structures 530, and extends into the surface of the silicon 512, such as to an exemplary depth of 200 nm. These buried bitlines 546 will act as source and drain diffusions (compare 314 and 316) of memory cells, and the poly lines 530 will function as the gate (compare 328) of the memory cells.

Figure 10:
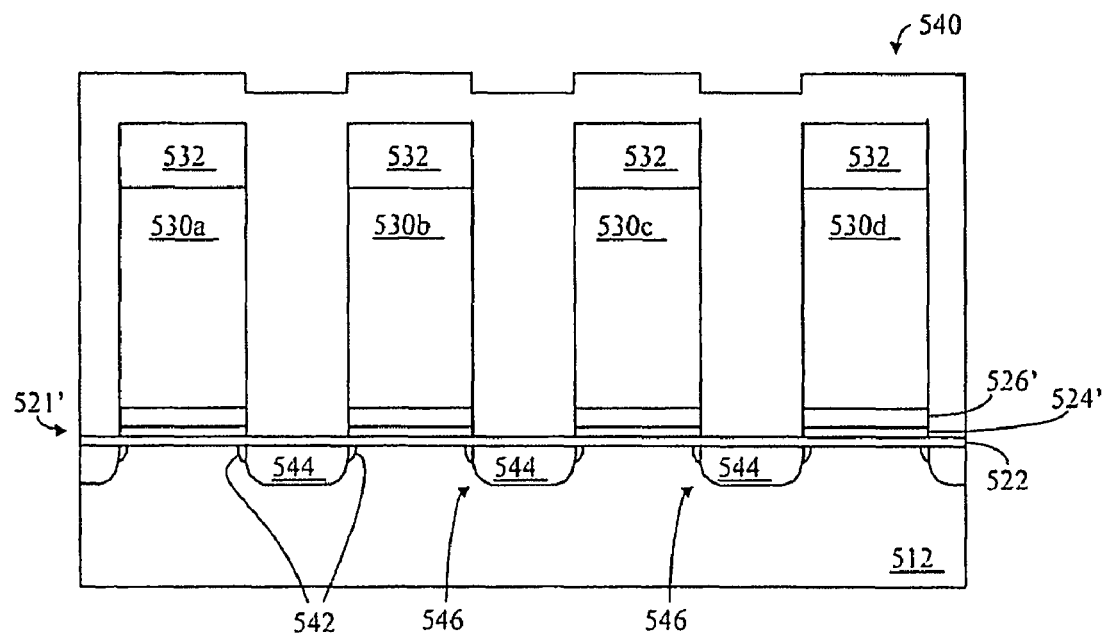

FIG. 10 illustrates a next step (Oxide Deposition and Fill) in the overall process of forming a memory array, with STI-bordered Array Contacts. Oxide 540 is deposited, filling, and overfilling the gaps between adjacent poly lines 530.

FIG. 11 illustrates a next step (Oxide CMP) in the overall process of forming a memory array, with STI-bordered Array Contacts. Excess oxide 540 overfilling the gaps between adjacent poly lines 530 is removed, using a chemical mechanical polishing (CMP) process. Note that the nitride hard mask 532 is still in place. The resulting oxide is labeled 540' (prime). Here it can be seen that the nitride 532, which polishes at a much slower rate than oxide, is useful as a CMP etch stop.

The oxide 540' remaining between adjacent poly lines 530 is directly over the corresponding buried bitlines 546, and may be referred to as "bitline oxide". Eventually, as will be described hereinbelow, openings will be made through these bitline oxides, and filled with a conductor (such as metal), to form bitline contacts in the contact region of the memory array.

Figure 12:
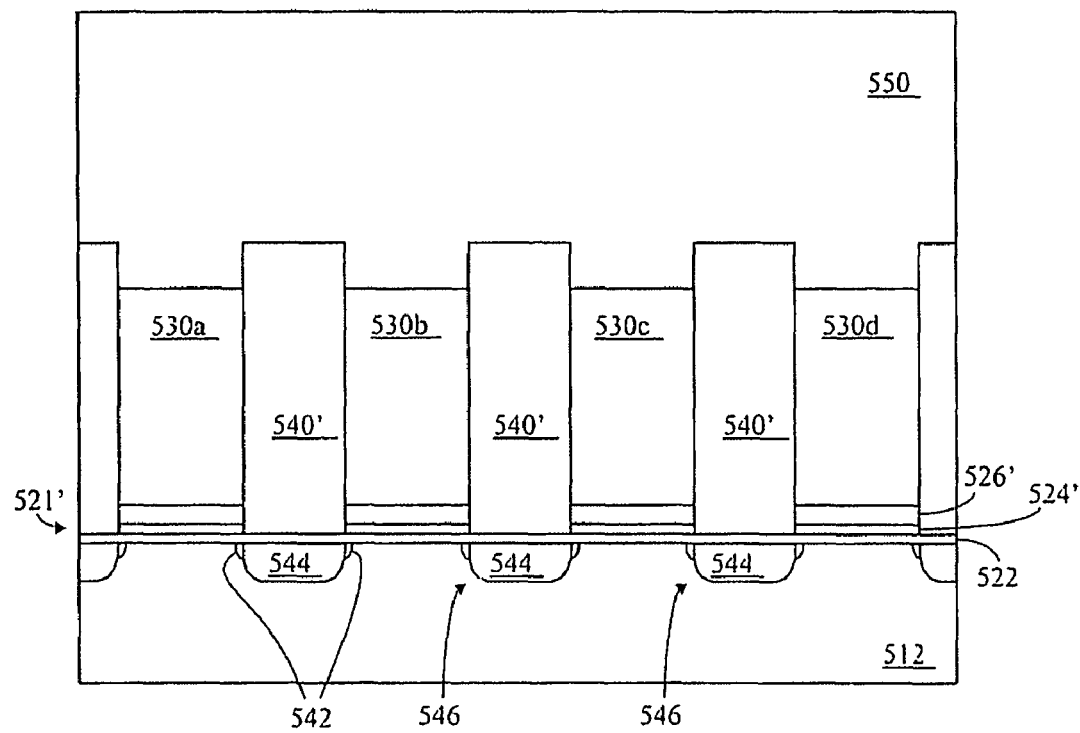

FIG. 12 illustrates a next step (Nitride Strip and Poly-2 Deposition) in the overall process of forming a memory array, with STI-bordered Array Contacts. The nitride hard mask 532 is stripped. Then, a layer 550 of polysilicon ("Poly-2") is deposited. The Poly-2 layer 550 may have an exemplary thickness of approximately 50 nm. The thicknesses of the Poly-1 and Poly-2 layers may, optionally, be determined by the periphery CMOS requirements.

Figure 13:
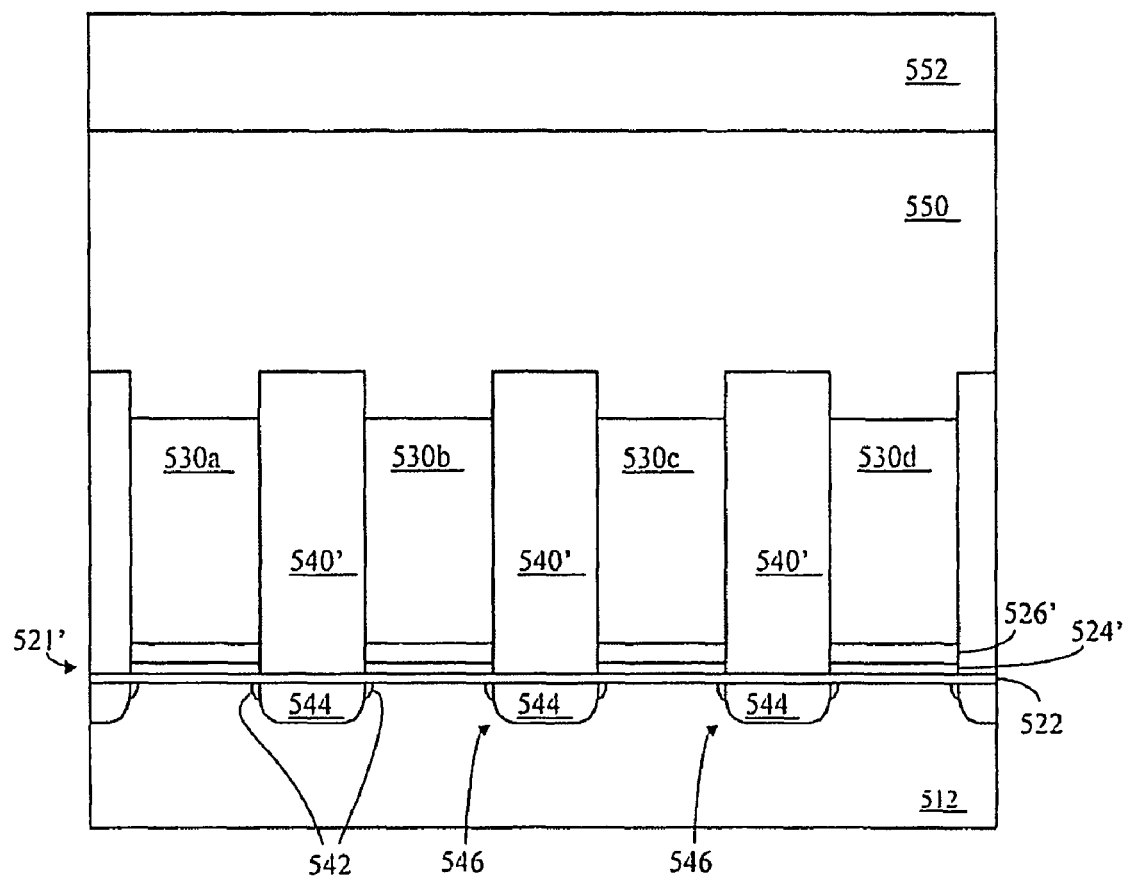

FIG. 13 illustrates a next step (Word Line Mask and Etch) in the overall process of forming a memory array, with STI-bordered Array Contacts. Photoresist 552 is applied, patterned, and the Poly-2 and Poly-1 layers 550 and 530 are etched, stopping on the top oxide layer 526' of the ONO stack 521' to form a plurality of word lines (554).

Figure 14:
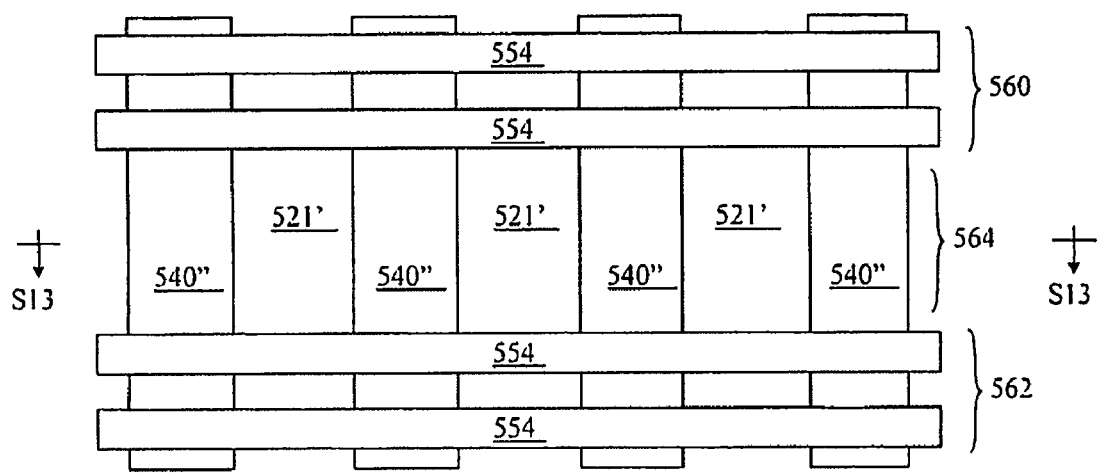
FIG. 14 is a plan view of the memory array (or a portion thereof) illustrating a subsequent step of the overall process of forming a memory array, according to this disclosure.

FIG. 14 illustrates the array near the contact area after the word lines 554 have been formed (Array Contact Area after Poly-2 and Poly-1 Word Line Etch), in the overall process of forming a memory array, with STI-bordered Array Contacts. As illustrated in this figure, two (of many) word lines are in a first group 560 of word lines 554, and are separated from two (of many) word lines which are in a second group 562 of word lines 554. A contact region 564 is disposed between the first and second groups of wordlines, and is representative of any number of contact regions which may be disposed throughout the memory array. In an exemplary embodiment of the process, the Poly-2 and Poly-1 layers may be etched from the contact area by the preceding word line mask and etch.

Figure 15:
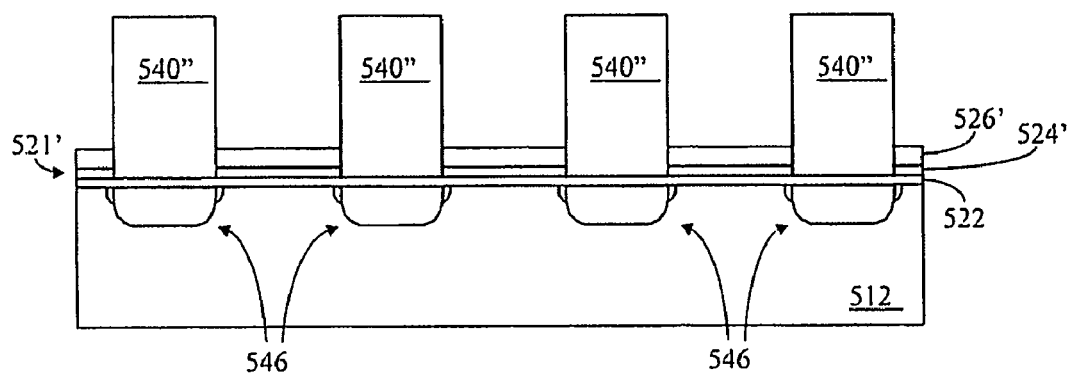
FIG. 15 is a cross-sectional view of a subsequent step of the overall process of forming a memory array, according to this disclosure.

In FIGS. 14 and 15, it can be seen that there are a number of buried bitlines (compare FIG. 9) running vertically in the array, and these buried bitlines are covered by bitline oxide 540" (double prime; "oxide pillars"), which has been thinned by the poly word line mask and etch in the previous step. Between the oxide pillars 540" is "residual" ONO 521', and this is where the silicon trench isolation (STI) will be formed. The bitlines 546 extend (or pass) through the contact area 564 of the array.

Whereas, in the past, STI would be formed before the bitlines, according to the disclosure, STI is formed after the bitlines, and is self-aligned thereto. The bitline oxide, which is part of the DPP flow described hereinabove, may be used to produce the self-aligned feature.

Figure 16:
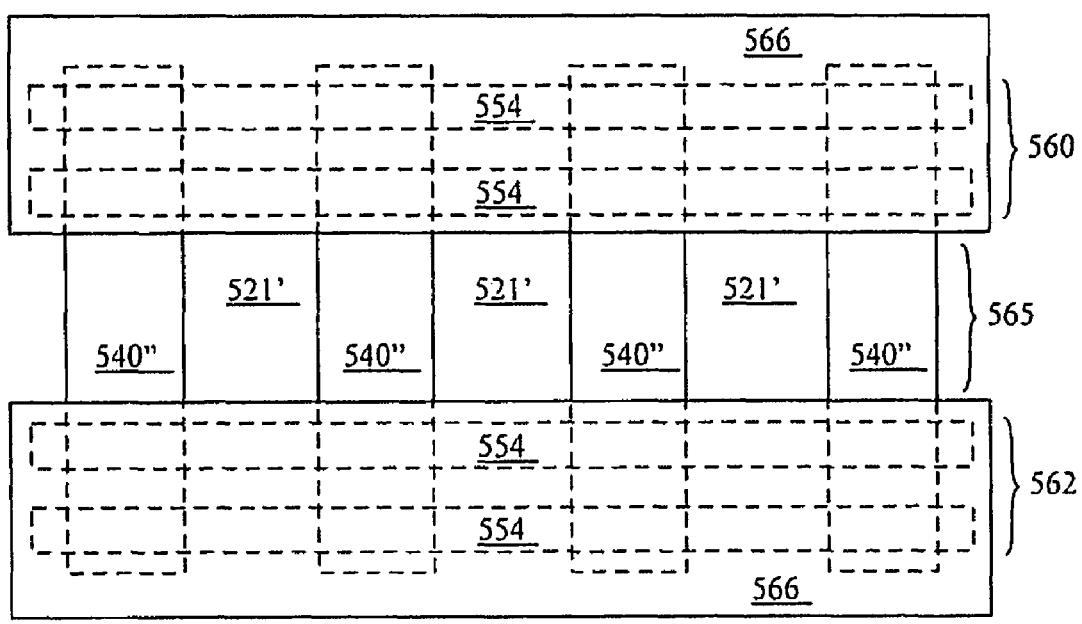
FIG. 16 is a plan view of the memory array (or a portion thereof) illustrating a subsequent step of the overall process of forming a memory array, according to this disclosure.

FIG. 16 illustrates a next step (Array STI Mask) in the overall process of forming a memory array, with STI-bordered Array Contacts. Generally, a masking material such as photoresist 566 is disposed over the wordline regions 560 and 562, as well as over portions of the contact region 564 immediately adjacent the wordline regions, leaving a portion, such as a central portion 565 of the contact region 564 "open" for further processing (and protecting the covered wordline regions from the further processing), as described hereinbelow.

Figure 17:
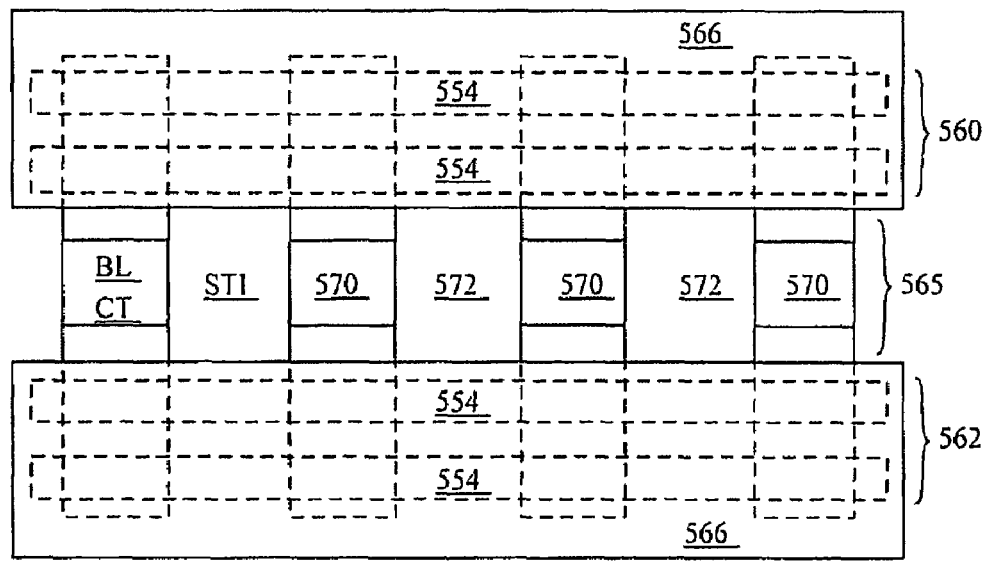
FIG. 17 is a plan view of the memory array (or a portion thereof) illustrating a subsequent step of the overall process of forming a memory array, according to this disclosure.
Figure 18:
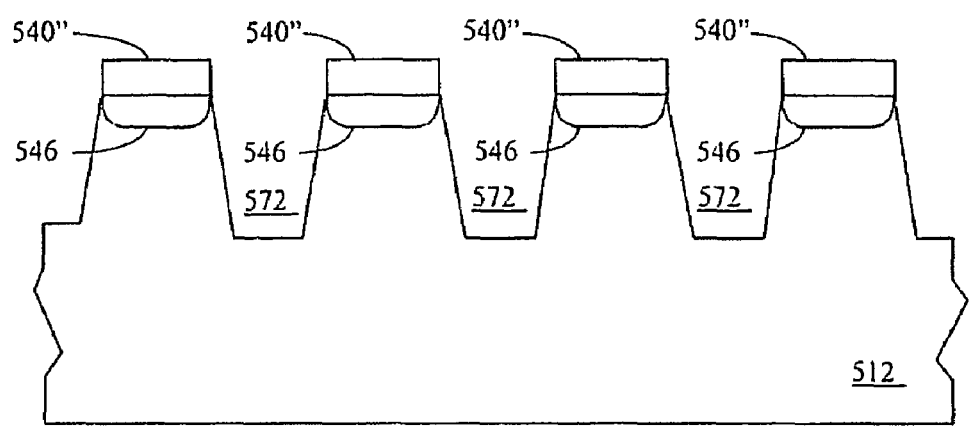
FIGS. 18-19 are cross-sectional views of subsequent steps of the overall process of forming a memory array, according to this disclosure.

FIGS. 17 and 18 illustrate a next step (ONO & STI Etch) in the overall process of forming a memory array, with STI-bordered Array Contacts. This will occur in the central portion 565 of the contact region 564 and is described in greater detail hereinbelow.

First, the residual ONO 521' is etched, and removed, from in-between the bitline oxides 540". This also etches (thins) the bitline oxides.

Then, the exposed silicon 512 between the bitline oxides 540" is etched, resulting in STI trenches 572 etched into the silicon 512, between the bitline oxides 540".

The STI trenches 572 may be etched using a reactive ion etch (RIE), which exhibits good selectivity to oxide.

The bitline oxides ("oxide pillars") 540" provide the masking for the silicon trench etch, so that the trenches 572 are self-aligned to the bitlines 546.

The depth of the STI trenches 572 in the Array Area may have an exemplary trench depth in the range of 50 nm-500 nm such as 100 nm-300 nm. Other STI trenches, formed in the CMOS (Periphery) Area, may be formed very early in the process (during the active area mask). Typically, a fab will have an STI etch module which is dictated by CMOS requirements. Thus they may feel that the STI in the Array has to be the same. However, as disclosed herein, STI in the Array Area may be formed separately and independently from STI in the CMOS Area.

The trenches 572 may extend into the silicon 512 at an angle somewhat less than 90-degrees, so that the trenches 572 taper from wider at the surface of the silicon to narrower within the silicon, and do not undercut the bitlines 546 (the trenches 572 taper away from the bitlines 546).

The thickness of the remaining bitline oxide 540", after STI etch is non-critical. For example, process parameters may be set to ensure at least 5 nm to 10 nm of remaining bitline oxide 540".

Lastly, an STI implant (not shown) can be performed, if necessary or if desired. The purpose of an STI implant would be to minimize leakage.

The use of bitline oxides (as a "mask") for STI trench etch represents a deviation from previous STI trench techniques, where STI trench etch occurs before bitline oxide formation, and requires a separate mask.

When the bitline is not self-aligned to the STI, a portion of the Active Area will have no n+ implant (part of the bitline implant will fall on the STI). If the contact lands on the part of the Active Area with no n+ implant, it may cause leakage. To avoid this leakage, typically an additional mask and n+ implant after the contact etch is required. Using the techniques disclosed herein, these additional steps may be avoided.

Eventually, bitline contacts (BLCT) will be formed, through inter-level dielectric (ILD), to the bitlines 546, as described hereinbelow, and will have substantially the same width as the bitlines (see also FIG. 5). Optionally, the widths may be made larger to overlap the self aligned STI thereby ensuring full coverage of the contact by the bitlines. The full coverage of the contacts by the bitlines may, if necessary, eliminate the use of an additional mask to implant into the contacts.

The following figures (commencing with FIG. 19) and descriptions are generally CMOS related and are included as an exemplary CMOS flow to illustrate its impact on the STI trench fill disclosed herein. Generally, the silicon trenches in the array will, optionally, be gap-filled with oxide and planarized as dictated by CMOS requirements. Salicidation of the silicon trench sidewalls and bottom must be avoided if a salicide module is included in the CMOS flow.

Figure 19:
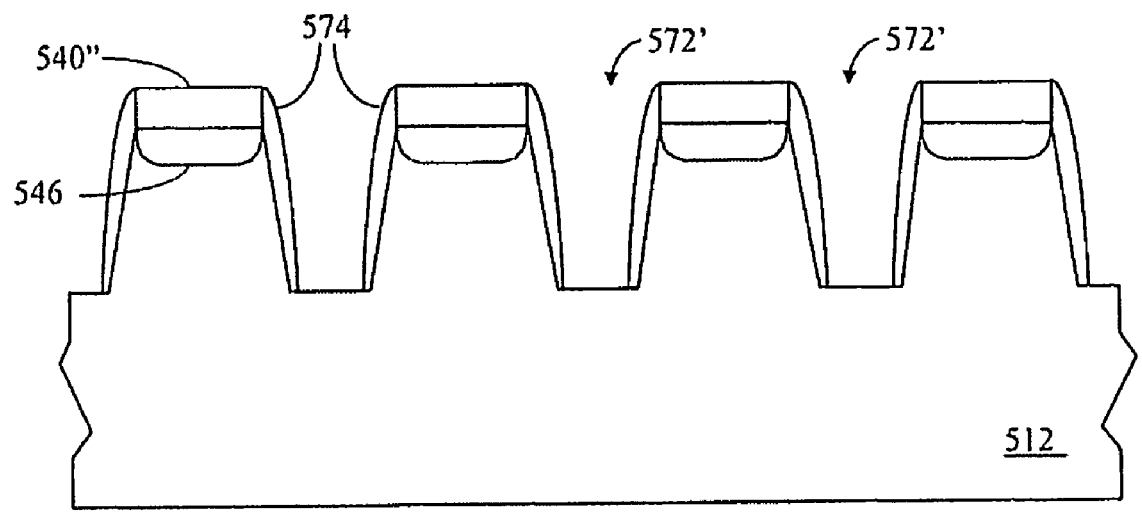

FIG. 19 illustrates a next step (CMOS Spacer Dep & Etch) in the overall process of forming a memory array, with STI-bordered Array Contacts. Spacer material 574 such as oxide, is deposited and etched, using conventional processes, resulting in oxide material on the sides of the STI trenches 572' (prime). (The purpose of sidewall spacer deposition is primarily related to the formation of CMOS devices in the periphery area.) Depending on sizes and process parameters, the spacer material 574 may fill at least a bottom portion of the STI trenches 572'.

The bitline oxides are subjected to the same steps of depositing spacer material and etching which are used to form sidewall spacers on the CMOS gate electrodes, and may therefore be considered to be related or corresponding structures. Sidewall formation is an example of etchback processes which in some areas of the chip (particularly in the CMOS area) may (for salicidation) or may not etch to silicon and which in other areas of the chip it is unimportant that they etch to the silicon. Whether (or not) the etch step results in exposing silicon between bitline oxides depends on the geometry of the bitline oxides versus the geometry of gate electrodes in the CMOS area. In some cases, etching adequate (and appropriate) for sidewall spacer etch in the CMOS area may be insufficient to expose silicon between the bitline oxides, which is a desirable result.

Figure 20:
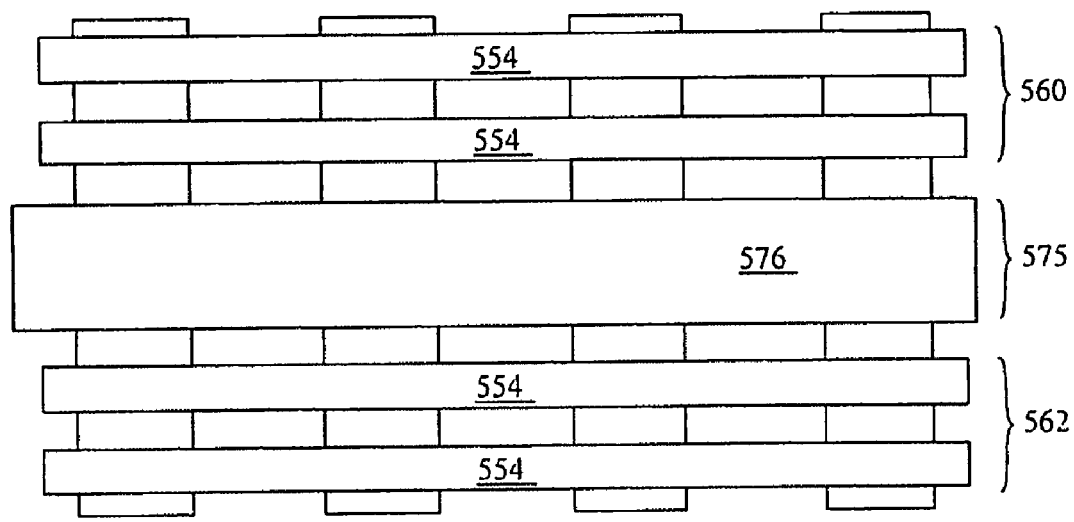
FIG. 20 is a plan view of the memory array (or a portion thereof) illustrating a subsequent step of the overall process of forming a memory array, according to this disclosure.
Figure 21:
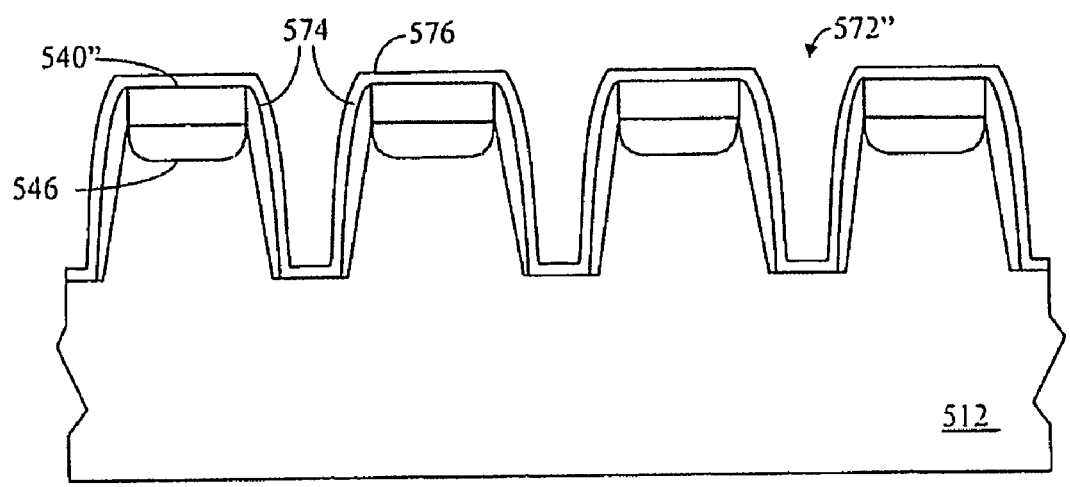
FIG. 21 is a cross-sectional view of a subsequent step of the overall process of forming a memory array, according to this disclosure.

FIGS. 20 and 21 illustrate a next step (Salicide Blocking Oxide Deposition) in the overall process of forming a memory array, with STI-bordered Array Contacts.

Here, in contrast with FIG. 17 (for example) where a central portion 565 of the contact region 564 was left unmasked (exposed) to experience a subsequent process step (such as STI trench etch), FIG. 20 illustrates that a central portion 575 (which may be the same as the central portion 565) of the contact region 564 is masked. The salicide blocking oxide layer 576 may have a thickness in the range of 10 nm-100 nm, such as 15 nm-50 nm. Layer 576 prevents the central portion 575 of the contact region 564 from being altered by a subsequent process step, such as salicidation. (The STI trenches 572" (double prime) are narrowed by the oxide layer 576.)

Figure 22:
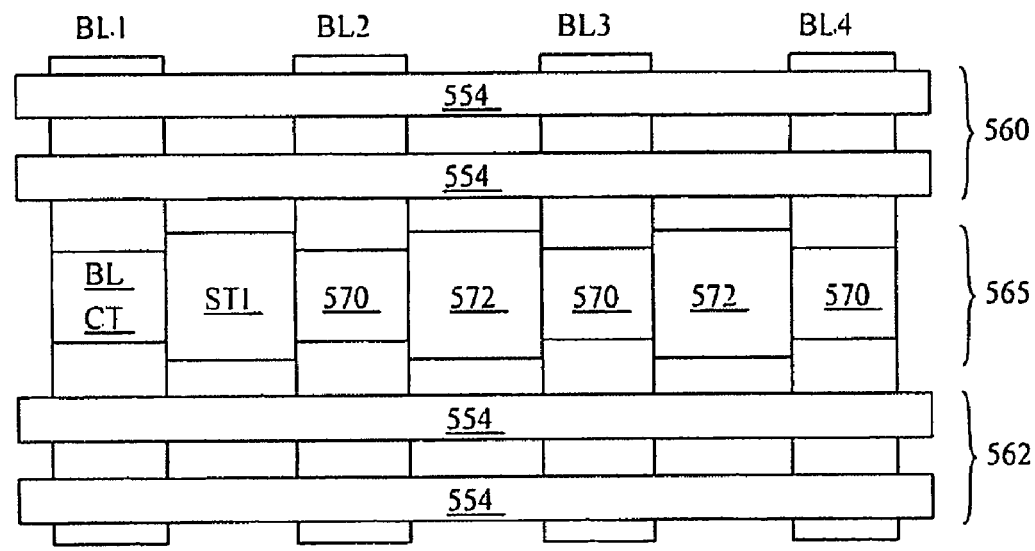
FIG. 22 is a plan view of the memory array (or a portion thereof) illustrating a subsequent step of the overall process of forming a memory array, according to this disclosure.

A layer of thin metal (cobalt or titanium or nickel) such as having a thickness in the range of 20 nm-200 nm may be deposited covering all areas. The metal is then silicided using a conventional salicidation process, (No patterning is necessary. Salicidation is self-aligned to the exposed silicon/polysilicon.) Salicidation is generally for the purpose of reducing the sheet resistance of the exposed silicon and poly-silicon areas FIG. 22 illustrates the resulting BL Contact Area 565 (central portion of the contact area 564) after salicidation. Salicidation does not impact the BL Contact Area since there is no exposed silicon in this area. Bitline contacts (BLCT) 570 will (but do not yet) extend to the bitlines (BL1 ... BL4). Silicon trench isolation (STI) 572 is formed between bitlines, adjacent the locations whereat the bitline contacts (BLCT) 570 will be formed. A first group of wordlines 554 are shown in a first cell area 560, and a second group of wordlines 554 are shown in a second cell area 562, separated from the first cell area 560 by the contact area 564.

Later in the process, a dielectric layer may be disposed over the entire device, to support upper level metalization such as wiring patterns, interconnects, word lines and bitlines which pass between several devices, as well as to external circuitry (not shown). This dielectric layer may be referred to as an inter level dielectric (ILD) layer.

Contacts will be opened through the ILD, to effect contact with the gate (such as 328) and the two diffusions (such as 314 and 316). With reference to the diffusions, it is particularly important that, in the process of creating the contact, the underlying diffusion is not damaged. It is thereby known, and is common practice to first form a capping layer over the device, and said capping layer (or cover liner) may act as a contact etch stop layer when etching the ILD to form the contacts.

Figure 23:
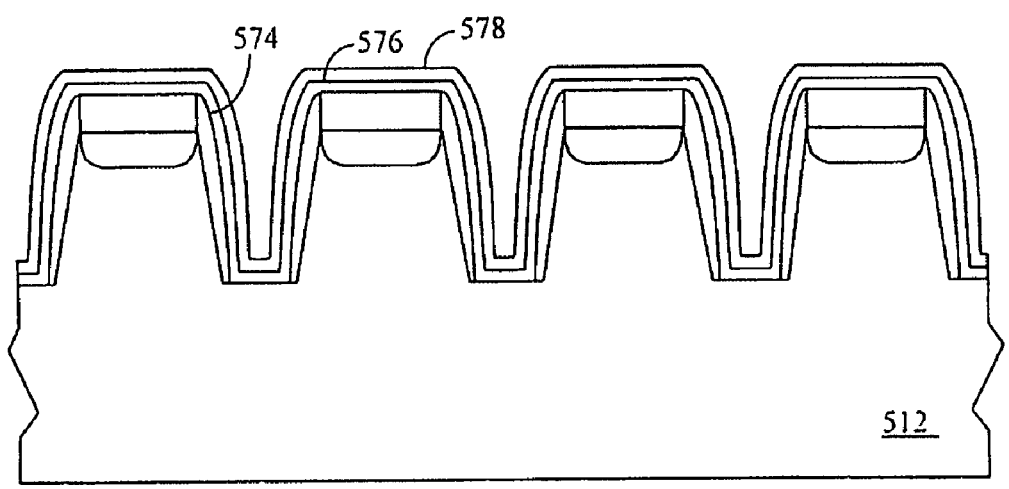
FIGS. 23-25 are cross-sectional views of subsequent steps of the overall process of forming a memory array, according to this disclosure.

FIG. 23 illustrates a next step (Contact Etch Stop Layer (CESL) Deposition) in the overall process of forming a memory array, with STI-bordered Array Contacts. A contact etch stop layer (CESL) 578, which may, for example, be nitride, is formed over the layer 576, and may have an exemplary thickness in the range of 10 nm-200 in, such as 20 nm-100 nm.

Figure 24:
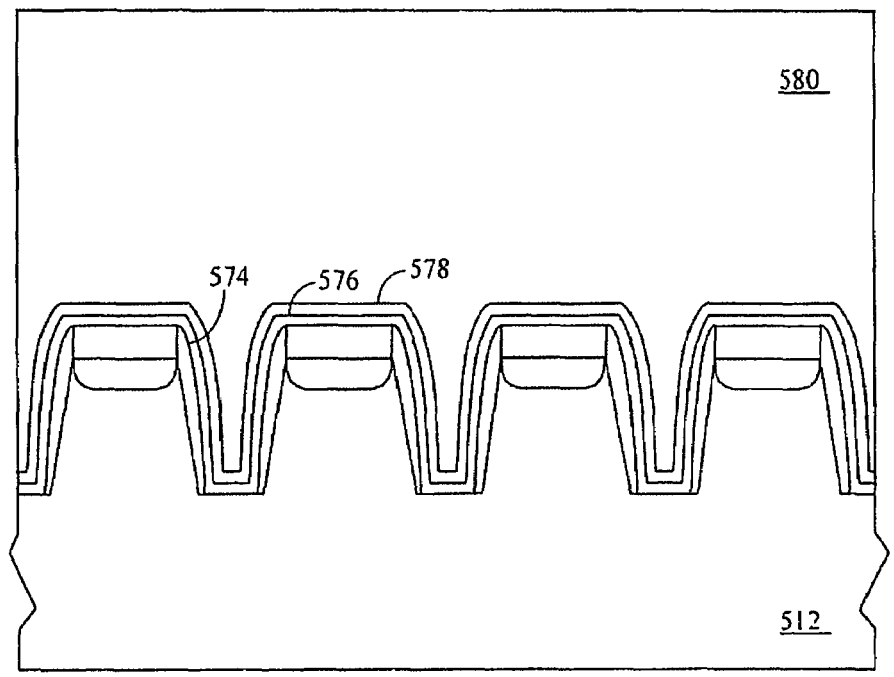

FIG. 24 illustrates a next step (ILD Oxide Fill and CMP) in the overall process of forming a memory array, with STI-bordered Array Contacts. Inter level dielectric (ILD) 580, such as oxide, is deposited, and may have an exemplary thickness in the range of 500 nm-1200 nm, such as 700 nm-1000 nm. A chemical mechanical polishing (CMP) step is performed to planarize the top surface of the oxide 580, in preparation for subsequent process steps (such as metalization).

Here (in FIG. 24, as well as in FIG. 33, below) is where a difference between the STI formation and filling techniques of the present disclosure can be discerned, in contrast with the previous techniques (as described above) where STI is formed early on, such as before ONO and with CMP. As can be seen here (in FIG. 24, as well as in FIG. 33, below), the trench 572 is filled with ILD oxide 580, so there is uninterrupted oxide all the way up to MI (as described in FIG. 25, as well as in FIG. 34).

Figure 25:
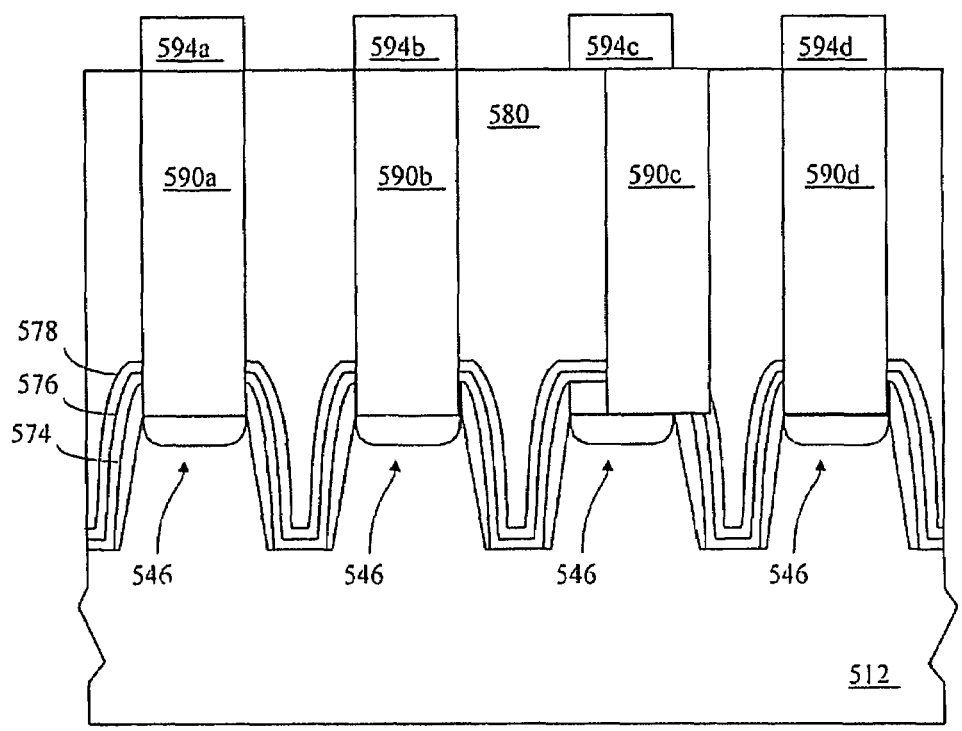

FIG. 25 illustrates next steps (ILD Oxide Fill and CMP; Contact Mask and Etch; Metal 1 Mask and Etch) in the overall process of forming a memory array, with STI-bordered Array Contacts.

Contact holes 590a ... 590d are formed through the ILD 580. This is done with a mask, and here is where misalignments may occur. The contact hole 590c is shown as being misaligned to the bitline. But since the STI is self-aligned to the bitline, the misalignment of the contact falls on the STI and is not a concern. Optionally, the width of the contact holes 590a ... 590d is such that even in the misaligned case, a full overlap with the bitline (546) is achieved. As before, the portion that lands on STI is not a concern since the STI is self aligned to the bitline. The full coverage of the contacts by the bitlines may, if necessary, eliminate the use of an additional mask to implant into the contacts.

Next the contact holes are filled (with a conductive material, such as metal) and, at the same time, a pattern of interconnects 594a ... 594d (Metal-1) may be provided. This is commonly referred to as "M1" (or "M-1").

Another Embodiment of an STI Process

According to an embodiment of the disclosure, silicon trench isolation (STI) between adjacent bitlines is formed self-aligned to bitlines, after salicidation, as described in greater detail hereinbelow.

As in the previously-described embodiment, this embodiment is described in the context of a dual poly process (DPP). As in the previously-described embodiment, the STI is self-aligned to the bitline(s).

Reference is made to FIGS. 1, 2, 3, 4, 4A, described hereinabove, as though set forth in their entirety herein.

Reference is made to FIGS. 5-13, described hereinabove, as though set forth in their entirety herein.

Generally, in the following figures, the reference numerals are incremented by 100 (from the 500-series to the 600-series) for elements that are similar to those described with respect to the previous embodiment. For example, word lines 654 (FIG. 26) are comparable to word lines 554 (FIG. 14). For example, the substrate 612 (FIG. 27) is comparable to the substrate 512 (FIG. 15).

Figure 26:
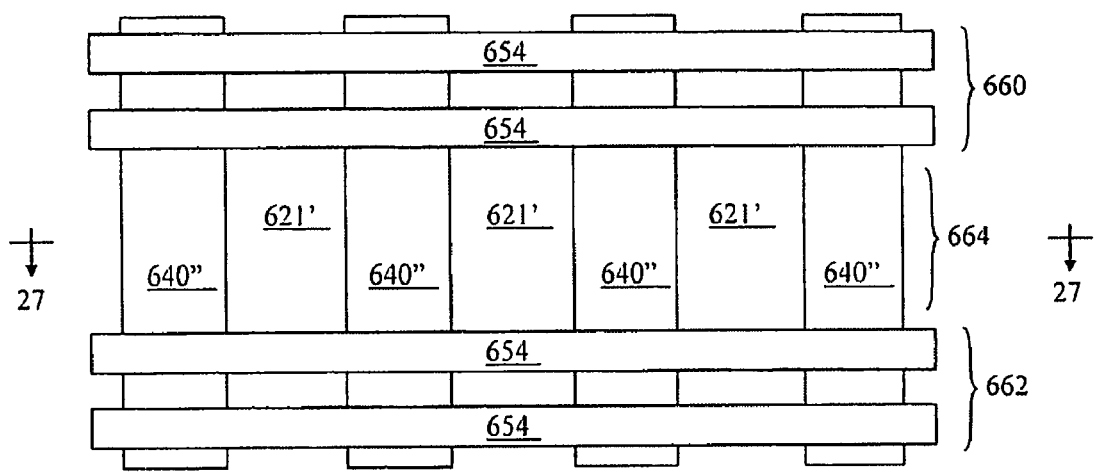
FIG. 26 is a plan view of a memory array (or a portion thereof) illustrating a subsequent step of the overall process of forming a memory array, according to another embodiment of this disclosure.

FIG. 26 (compare FIG. 14) illustrates the array after the word lines 654 have been formed (Array Contact Area after Poly-2 word Line Etch), in the overall process of forming a memory array, with STI-bordered Array Contacts. As illustrated in this figure, two (of many) word lines are in a first group 660 of wordlines 654, and are separated from two (of many) word lines, which are in a second group 662 of wordlines 654. A contact region 664 is disposed between the first and second groups of wordlines, and is representative of any number of contact regions which may be disposed throughout the memory array.

Figure 27:
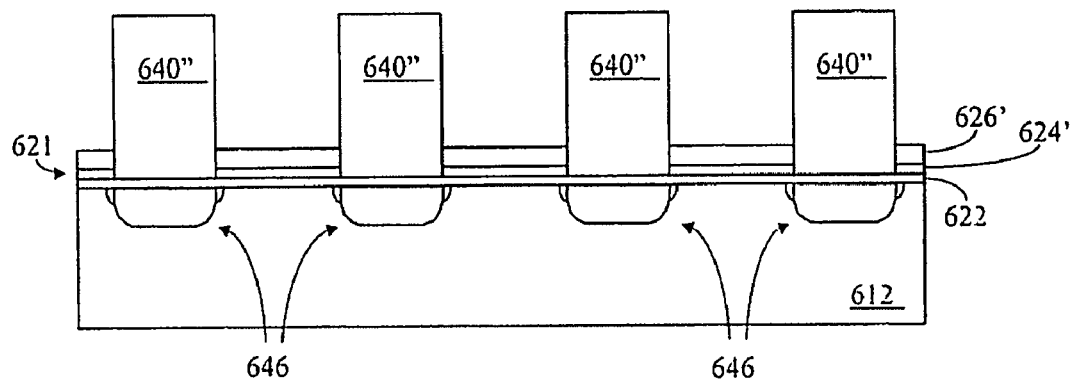
FIGS. 27-28 are cross-sectional views of subsequent steps of the overall process of forming a memory array, according to this disclosure.

In FIGS. 26 and 27 (compare FIG. 15), it can be seen that there are a number of buried bitlines (compare FIG. 9) running vertically in the array, and these buried bitlines are covered by bitline oxide 640" (double prime; "oxide pillars"), which has been thinned by the poly etch in the previous step. Between the oxide pillars 640" is "residual" ONO 621', and this is where the silicon trench isolation (STI) will be formed.

In the previous embodiment, after the steps described with respect to FIGS. 14 and 15, the cell areas 660 and 662 were masked (FIG. 16), and silicon trench isolation (FIGS. 17 and 18) were etched between the bitlines.

Figure 28:
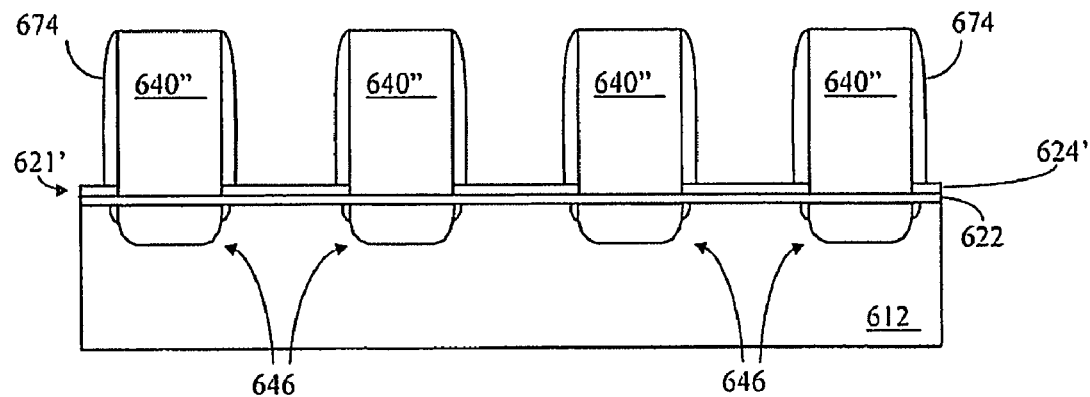

FIG. 28 illustrates that, in this embodiment, the next step (after FIG. 27) is the formation of CMOS sidewall spacers prior to salicidation. Also, these sidewall spacers 674 (before trench) are formed on the bitline oxides 640". Because of the etch involved, this step of spacer formation may cause removal of the top oxide layer (526') of the ONO stack 621', between the bitline oxides 640".

A layer of thin metal (cobalt or titanium or nickel) such as having a thickness in the range of 20 nm-200 nm may be deposited covering all areas. The metal is then silicided using a conventional salicidation process, (No patterning is necessary. Salicidation is self-aligned to the exposed silicon/poly-silicon.) Salicidation is generally for the purpose of reducing the sheet resistance of the exposed silicon and poly-silicon areas. Salicidation does not impact the BL Contact Area since there is no exposed silicon in this area.

Figure 29:
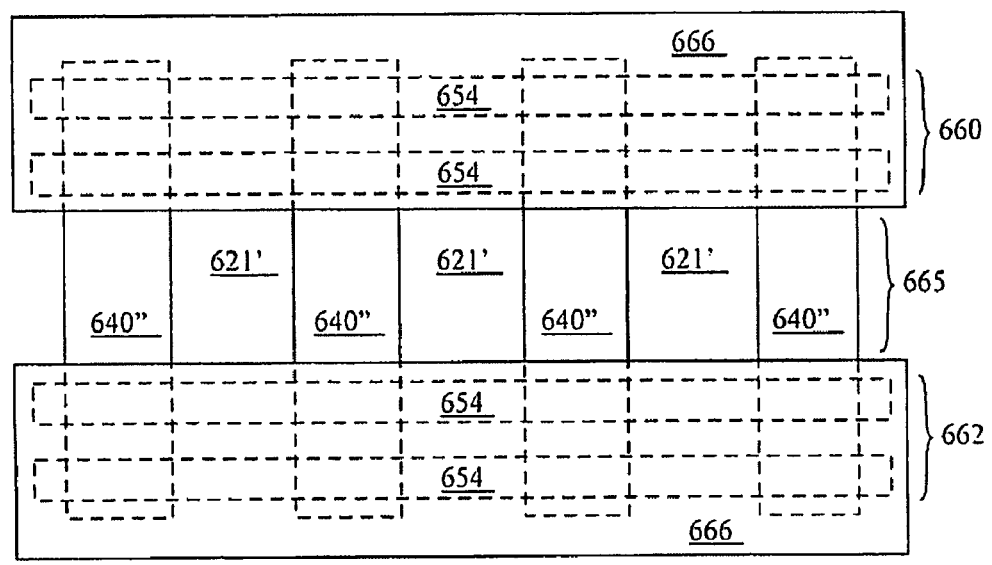
FIG. 29 is a plan view of the memory array (or a portion thereof) illustrating a subsequent step of the overall process of forming a memory array, according to this disclosure.

FIG. 29 (compare FIG. 16) illustrates a next step (Array STI Mask) in the overall process of forming a memory array, with STI-bordered Array Contacts. Generally, a masking material such as photoresist 666 is disposed over the salicided wordline regions 660 and 662, as well as over portions of the contact region 664 immediately adjacent the wordline regions, leaving a portion, such as a central portion 665 of the contact region 664 "open" for further processing (and protecting the covered wordline regions from the further processing), as described hereinbelow.

Figure 30:
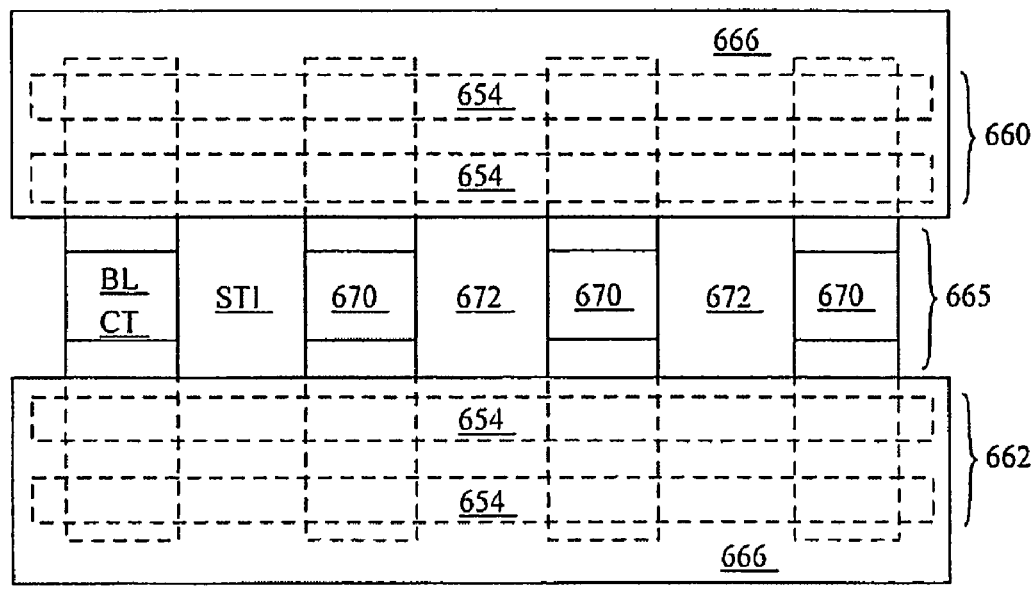
FIG. 30 is a plan view of the memory array (or a portion thereof) illustrating a subsequent step of the overall process of forming a memory array, according to this disclosure.
Figure 31:
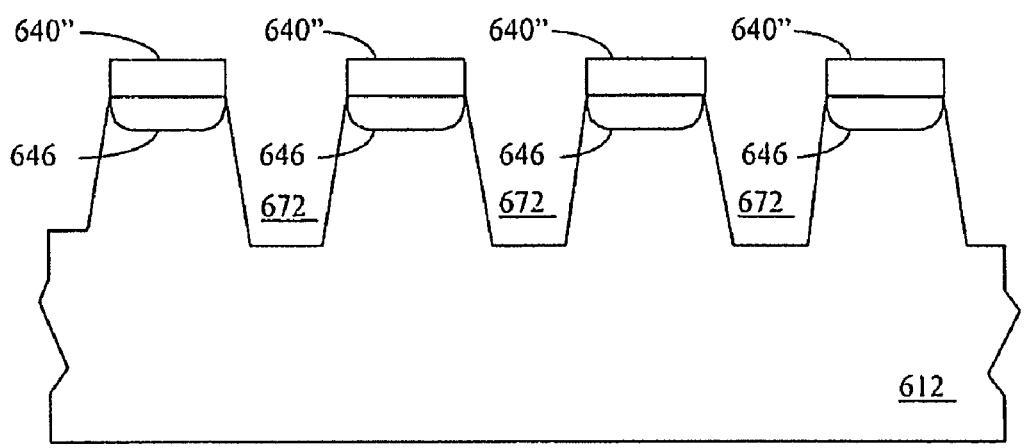
FIGS. 31-34 are cross-sectional views of subsequent steps of the overall process of forming a memory array, according to this disclosure.

FIGS. 30 and 31 (compare FIGS. 17 and 18) illustrate a next step (ONO & STI Etch) in the overall process of forming a memory array, with STI bordered Array Contacts. This will occur in the portion 665 of the contact region 664 not covered by photoresist and is described in greater detail hereinbelow.

Bit line contacts (BLCT) 670 are shown.

First, the residual ONO 621' is etched, and removed, from in-between the bitline oxides 640". This also etches (thins) the bitline oxides.

Then, the exposed silicon 612 between the bitline oxides 640" is etched, resulting in STI trenches 672 etched into the silicon 612, between the bitline oxides 640".

The STI trenches 672 may be etched using a reactive ion etch (RIE), which exhibits good selectivity to oxide, The bitline oxides ("oxide pillars") 640" provide the masking for the silicon trench etch, so that the trenches 672 are self-aligned to the bitlines.

The depth of the STI trenches 672 in the Array Area may have an exemplary trench depth in the range of 50 nm-500 nm such as 100 nm-300 nm. Other STI trenches (not shown), formed in the CMOS (Periphery) Area, may be formed very early in the process (during the active area mask). Typically, a fab will have an STI etch module which is dictated by CMOS requirements. Thus, they may feel that the STI in the Array has to be the same. However, as disclosed herein, STI in the Array Area may be formed separately and independently from STI in the CMOS Area.

The trenches 672 may extend into the silicon 612 at an angle somewhat less than 90-degrees, so that the trenches 672 taper from wider at the surface of the silicon to narrower within the silicon, and do not undercut the bitlines 646 (the trenches 672 taper away from the bitlines 646).

The thickness of the remaining bitline oxide 640", after STI etch is non-critical. For example, process parameters may be set to ensure at least 5 nm to 10 nm of remaining bitline oxide 640".

Lastly, an STI implant (not shown) can be performed, if necessary or if desired. The purpose of an STI implant would be to minimize leakage.

The use of bitline oxides (as a "mask") for STI trench etch represents a deviation from previous STI trench techniques, where STI trench etch occurs before bitline oxide formation, and requires a separate mask.

When the bitline is not self-aligned to the STI, a portion of the Active Area will have no n+ implant (part of the bitline implant will fall on the STI). If the contact lands on the part of the Active Area with no n+ implant, it may cause leakage. To avoid this leakage, typically an additional mask and n+ implant after the contact etch is required. Using the techniques disclosed herein, these additional steps may be avoided.

Eventually, bitline contacts (BLCT) will be formed, through inter-level dielectric (ILD), to the bitlines 646, as described hereinbelow, and will have substantially the same width as the bitlines (see also FIG. 5). Optionally, the widths of the contacts may be made larger to overlap the self aligned STI thereby ensuring full coverage of the contact by the bitlines. The full coverage of the contacts by the bitlines may, if necessary, eliminate the use of an additional mask to implant into the contacts.

Figure 32:
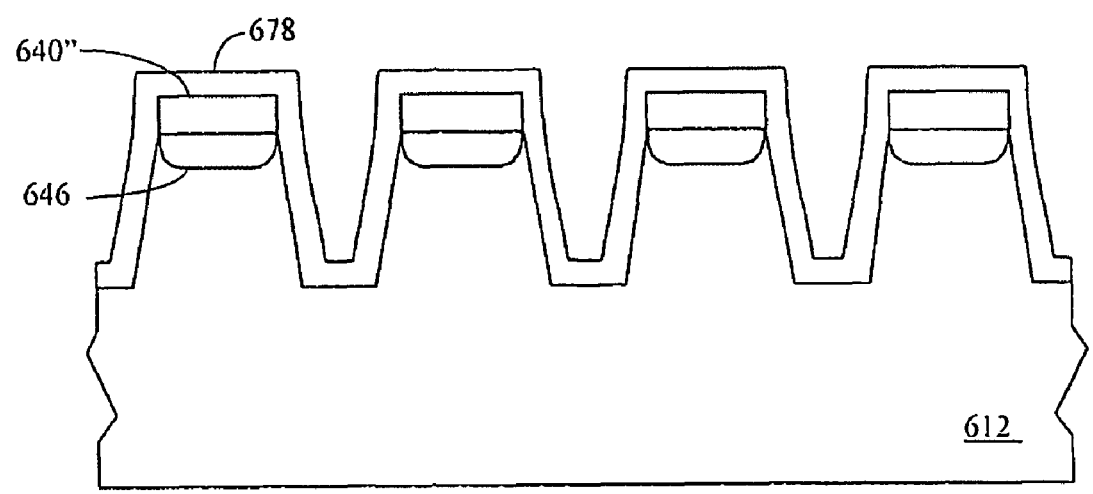

FIG. 32 illustrates a next step (Contact Etch Stop Layer (CESL) Deposition) in the overall process of forming a memory array, with STI-bordered Array Contacts. A contact etch stop layer (CESL) 678, which may, for example, be nitride, is formed over the oxide 640", and may have an exemplary thickness in the range of 10 nm-200 nm, such as 20 nm-100 nm. This is similar to FIG. 23, but without spacer 574 and salicide blocking oxide 576.

Figure 33:
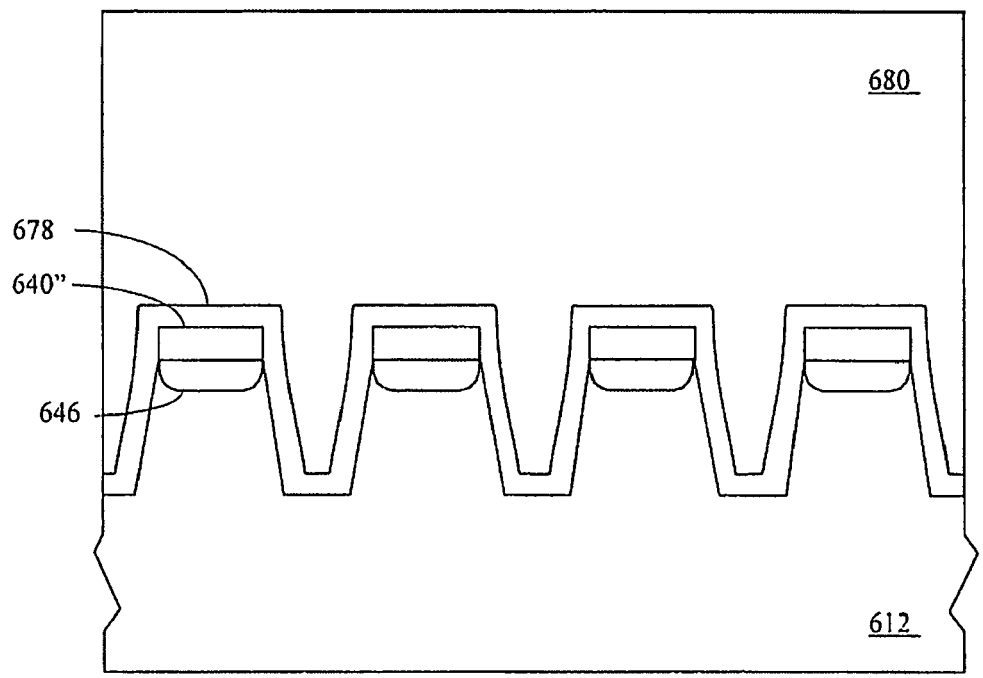

FIG. 33 (compare FIG. 24) illustrates a next step (ILD Oxide Fill and CMP) in the overall process of forming a memory array, with STI-bordered Array Contacts. Inter level dielectric (ILD) 680, such as oxide, is deposited, and may have an exemplary thickness in the range of 500 nm-1200 nm, such as 700 nm-1000 nm. A chemical mechanical polishing (CMP) step is performed to planarize the top surface of the oxide 680, in preparation for subsequent process steps (Such as metalization). This is similar to FIG. 24, but without spacer 574 and salicide blocking oxide 576.

Here (in FIG. 33, as well as in FIG. 24, above) is where a difference between the STI formation and filling techniques of the present disclosure can be discerned, in contrast with techniques where the STI is formed early on, such as before ONO and with CMP. As can be seen here (in FIG. 33, as well as in FIG. 24, above), the trench 672 is filled with ILD oxide 680, so there is uninterrupted oxide all the way up to M1 (as described in FIG. 34, as well as in FIG. 25).

Figure 34:
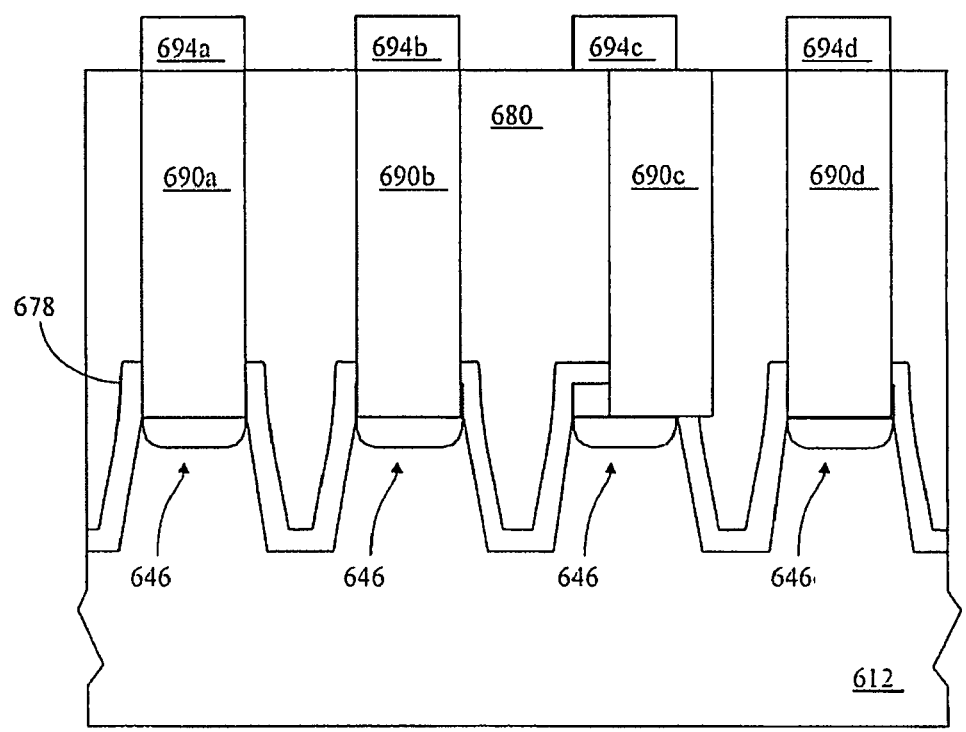

FIG. 34 (compare FIG. 25) illustrates next steps (ILD Oxide Fill and CMP; Contact Mask and Etch; Metal 1 Mask and Etch) in the overall process of forming a memory array, with self-aligned STI-bordered Array Contacts.

Contact holes 690a . . . 690d are formed through the ILD 680. This is done with a mask, and here is where misalignments may occur. The contact hole 690c is shown as being misaligned to the bitline. But since the STI is self-aligned to the bitline, the misalignment of the contact falls on the STI and is not a concern. Optionally, the width of the contact holes 690a.690d is such that even in the misaligned case, a full overlap with the bitline is achieved. As before, the portion that lands on STI is not a concern since the STI is self aligned to the bitline. The full coverage of the contacts by the bitlines may, if necessary, eliminate the use of an additional mask to implant into the contacts.

Next the contact holes are filled (with a conductive material, such as metal) and, at the same time, a pattern of interconnects 694a . . . 694d (Metal-1) may be provided.

While a number of exemplary aspects and embodiments have been discussed above, those of skill in the art will recognize certain modifications, permutations, additions and sub-combinations thereof. It is therefore intended that the following appended claims and claims hereafter introduced be interpreted to include all such modifications, permutations, additions and sub-combinations.

What is claimed is:

1. An array of memory cells comprising:
a plurality of bitlines extending through a contact area in the array;
silicon trench isolation (STI) trenches disposed in the contact area, and self-aligned between adjacent bitlines;
memory devices connected between the bitlines in a cell area adjacent to the contact area; and
inter-level dielectric covering the memory devices and filling the STI trenches; and
said STI trenches of the STI are lined with a CMOS spacer.

2. The array of claim 1, wherein:
the bitlines are composed of material selected from the group consisting of silicides, metals, raised diffusions or buried bitlines.

3. The array of claim 1, wherein:
the STI trenches of the STI are lined with a salicide blocking layer.

4. The array of claim 1, wherein:
the STI trenches of the STI are lined with a contact etch stop layer.

5. The array of claim 1, wherein:
the STI trenches of the STI are lined with a salicide blocking layer and a contact etch stop layer.

6. The array of claim 1, wherein:
the memory cells comprise NVM devices.

7. The array of claim 5, wherein:
the NVM devices are selected from the group consisting of NROM, SONOS, SANOS, MANOS, TANOS and Floating Gate (FG) devices.

* * * * *